US012588341B2

(12) United States Patent (10) Patent No.: US 12,588,341 B2
Li et al. (45) Date of Patent: Mar. 24, 2026

(54) DISPLAY PANEL AND ELECTRONIC DEVICE

(71) Applicant: Wuhan Tianma Micro-Electronics Co., Ltd., Wuhan (CN)

(72) Inventors: Fei Li, Wuhan (CN); Xu Tian, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 411 days.

(21) Appl. No.: 18/129,650

(22) Filed: Mar. 31, 2023

(65) Prior Publication Data

US 2024/0072223 A1 Feb. 29, 2024

(30) Foreign Application Priority Data

Aug. 24, 2022 (CN) .......................... 202211018714.6

(51) Int. Cl.
*H01L 33/62* (2010.01)
*H01L 25/16* (2023.01)
*H10D 86/40* (2025.01)
*H10D 86/60* (2025.01)
*H10H 20/857* (2025.01)

(52) U.S. Cl.
CPC ......... *H10H 20/857* (2025.01); *H01L 25/167* (2013.01); *H10D 86/441* (2025.01); *H10D 86/60* (2025.01)

(58) Field of Classification Search
None
See application file for complete search history.

(56) References Cited

FOREIGN PATENT DOCUMENTS

CN 109445210 A 3/2019
CN 113964142 A * 1/2022 ............. H10D 86/60

* cited by examiner

*Primary Examiner* — William C Trapanese
(74) *Attorney, Agent, or Firm* — Anova Law Group, PLLC

(57) ABSTRACT

Display panel and electronic device are provided. The display panel includes a display area and a non-display area at least partially surrounding the display area. The display panel includes: a plurality of signal lines, extending along a first direction and located in the display area, the display area including a first display area and a second display area disposed adjacent to the first display area along a second direction, the display area including a first side extending along the first direction, and the first display area located between the first side and the second display area; first signal connection lines, extending through the display area along a first non-display area on a side of the display area to a second non-display area on the other side of the display area, the first non-display area including a bonding area; and second signal connection lines, extending along the second non-display area.

21 Claims, 24 Drawing Sheets

100

DISPLAY PANEL AND ELECTRONIC DEVICE

CROSS-REFERENCE TO RELATED APPLICATION

This application claims priority of Chinese Patent Application No. 202211018714.6, filed on Aug. 24, 2022, the entire contents of which are hereby incorporated by reference.

FIELD OF THE DISCLOSURE

The present disclosure generally relates to the field of electronic device technology and, more particularly, relates to a display panel and an electronic device.

BACKGROUND

Nowadays, electronic devices with display function are widely used. Display panel is a main component for an electronic device to realize the display function. The display panel includes a display area and a border area. Pixel structures for image display are disposed in the display area. Traces and display driver chips are disposed in the border area.

In an existing display panel, with a continuous improvement in resolution, more and more signal lines in a display area are configured connecting to a non-display area, resulting in a larger width of the border area.

BRIEF SUMMARY OF THE DISCLOSURE

One aspect of the present disclosure provides a display panel. The display panel includes a display area and a non-display area at least partially surrounding the display area. The display panel includes: a plurality of signal lines, extending along a first direction and located in the display area, the display area including a first display area and a second display area disposed adjacent to the first display area along a second direction, the display area including a first side extending along the first direction, and the first display area located between the first side and the second display area; first signal connection lines, extending through the display area along a first non-display area on a side of the display area to a second non-display area on the other side of the display area, the first non-display area including a bonding area; and second signal connection lines, extending along the second non-display area, an end of a second signal connection line being connected to a first signal connection line, and another end of the second signal connection line being connected to any one of the plurality of signal lines in the first display area.

Another aspect of the present disclosure provides an electronic device. The electronic device includes a display panel. The display panel includes a display area and a non-display area at least partially surrounding the display area. The display panel includes: a plurality of signal lines, extending along a first direction and located in the display area, the display area including a first display area and a second display area disposed adjacent to the first display area along a second direction, the display area including a first side extending along the first direction, and the first display area located between the first side and the second display area; first signal connection lines, extending through the display area along a first non-display area on a side of the display area to a second non-display area on the other side of the display area, the first non-display area including a bonding area; and second signal connection lines, extending along the second non-display area, an end of a second signal connection line being connected to a first signal connection line, and another end of the second signal connection line being connected to any one of the plurality of signal lines in the first display area.

Other aspects of the present disclosure can be understood by a person skilled in the art in light of the description, the claims, and the drawings of the present disclosure.

BRIEF DESCRIPTION OF THE DRAWINGS

To illustrate technical solutions more clearly in embodiments of the present disclosure, accompanying drawings that need to be used in descriptions of the embodiments or in the art are briefly introduced as follows. Obviously, the accompanying drawings described as follows are merely used for the embodiments of the present disclosure, other accompanying drawings can also be obtained according to the provided accompanying drawings without creative efforts by a person skilled in the art.

Structures, proportions, sizes, and the like shown in the accompanying drawings of the specification are only used to cooperate with contents disclosed in the specification for understanding and reading by a person skilled in the art and are not intended to limit conditions under which the present disclosure can be implemented and therefore have no technical significance. Any modifications to structures, changes to proportional relationships or adjustments on sizes should fall within a scope of technical contents disclosed by the present disclosure without affecting effects and objectives achieved by the present disclosure.

DETAILED DESCRIPTION

The following clearly describes technical solutions in the embodiments of the present disclosure with reference to the accompanying drawings in the embodiments. Obviously, the described embodiments are just a part but not all the embodiments of the present disclosure. All other embodiments obtained by a person skilled in the art based on the embodiments of the present disclosure without creative efforts fall within the protection scope of the present disclosure.

Figure 1:
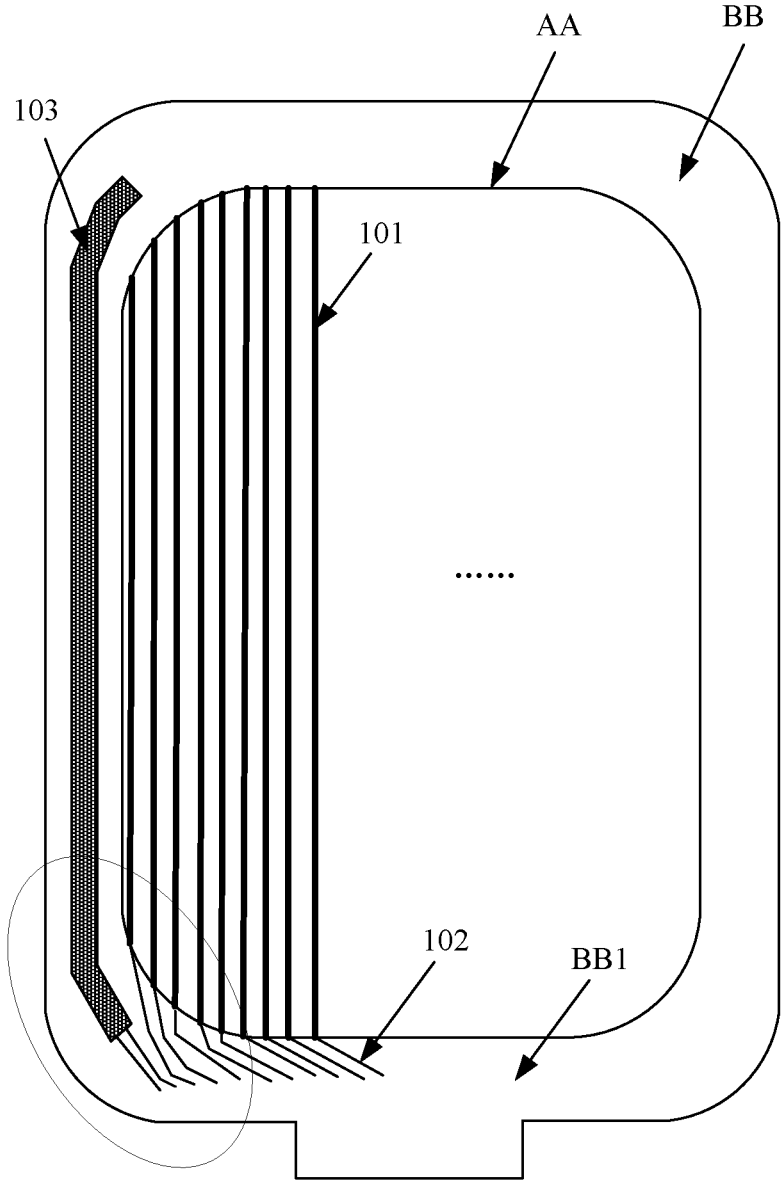
FIG. 1 illustrates a schematic diagram of a display panel.

FIG. 1 illustrates a schematic diagram of a display panel. The display panel includes a display area AA and a non-display area BB. The display area AA is provided with pixel structures (not shown) for image display and signal lines 101 connected to the pixel structures. The non-display area BB is provided with a scan circuit 103. The pixel structures perform image display based on scan signals provided by the scan circuit 103 and setting signals provided by the signal lines 101. The signal lines 101 can be data lines for providing data signals for the pixel structures.

The scan circuit 103 and ends of the signal lines 101 facing a first non-display area BB1 need to be connected to fan-out lines 102 to be connected to a bonding area in the first non-display area BB1. As shown in FIG. 1, in a top corner area of the first non-display area BB1 close to the display area AA, the scan circuit 103 and the fan-out lines 102 of the signal lines 101 need to be disposed at a same time, resulting in a larger border width of the top corner area.

Moreover, four vertices of the display area AA in a current display panel are mostly set with R angles (as shown by a dotted ellipse in FIG. 1), that is, vertex areas are convex arcs. To improve display quality, at an arc-shaped R corner position, light-emitting elements in the pixel structures need to be adapted to the arc-shaped R corner and placed in a stepped shape. Scan lines and signal lines connected to part of the light-emitting elements need to be arranged in a non-display area near the R corner, and various traces connected to the light-emitting elements in a middle display area may also occupy part of the non-display area near the R corner, resulting in a larger border width in the non-display area near the R corner, so that the non-display area BB accounts for a larger proportion of the panel.

To solve the above problems, the embodiments of the present disclosure provide a display panel and an electronic device. The display panel includes a display area and a non-display area at least partially surrounding the display area. The display panel includes: a plurality of signal lines, extending along a first direction and located in the display area; the display area including a first display area and a second display area adjacently disposed along a second direction, the display area having a first side extending along the first direction, and the first display area located between the first side and the second display area; first signal connection lines, extending through the display area along a first non-display area on a side of the display area to a second non-display area on the other side of the display area, the first non-display area includes a bonding area; and second signal connection lines, extending along the second non-display area, an end of a second signal connection line of the second signal connection lines being connected to a first signal connection line of the first signal connection lines, and the other end of the second signal connection line of the second signal connection lines being connected to any one of the plurality of signal lines in the first display area.

In a technical solution of the present disclosure, the plurality of signal lines in the first display area are set to be connected to the first signal connection lines in the second display area through the second signal connection lines in the second non-display area, so that at least part of the plurality of signal lines in the first display area can be led out from the second display area to the first non-display area. Therefore, wiring spaces in areas opposite to the first non-display area and the first display area can be saved, and at least border widths of the display panel in the areas can be reduced.

To make the above objects, features and advantages of the present disclosure more clearly understood, the present disclosure is described in further detail below with reference to the accompanying drawings and specific embodiments.

Figure 2:
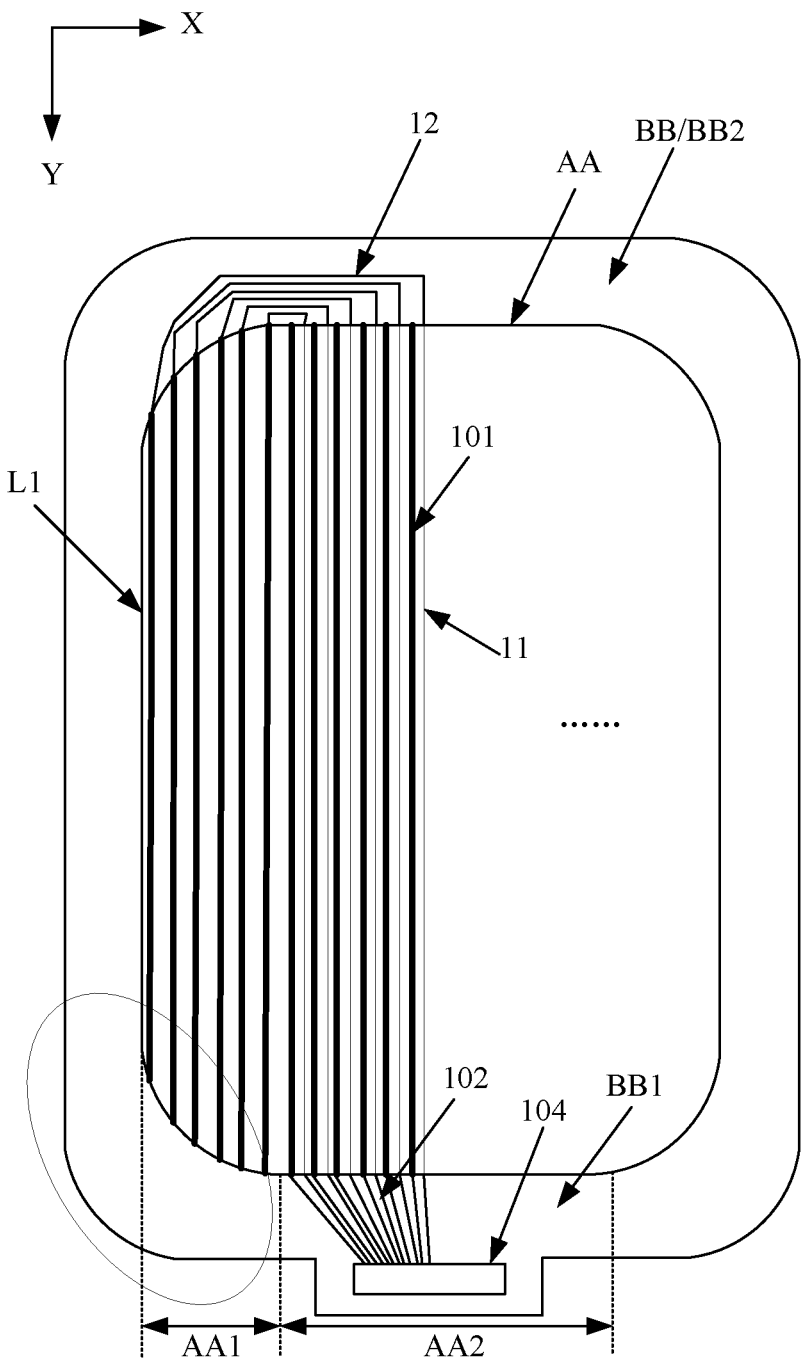
FIG. 2 illustrates a schematic diagram of a display panel consistent with various embodiments of the present disclosure.

FIG. 2 illustrates a schematic diagram of a display panel consistent with various embodiments of the present disclosure. The display panel includes a display area AA and a non-display area BB at least partially surrounding the display area AA. The display panel includes: a plurality of signal lines 101, extending along a first direction Y and located in the display area AA; the display area AA including a first display area AA1 and a second display area AA2 adjacently disposed along a second direction X, the display area AA having a first side L1 extending along the first direction, and the first display area AA1 being located between the first side L1 and the second display area AA2, the second direction X being perpendicular to the first direction Y, and both the first direction Y and the second direction X being parallel to the display panel; first signal connection lines 11, extending through the display area AA along a first non-display area BB1 on a side of the display area to a second non-display area BB2 on the other side of the display area, the first non-display area BB1 including a bonding area 104, and the extension direction of the first signal connection line 11 being parallel to the first direction Y; and second signal connection lines 12, extending along the second non-display area BB2, an end of the second connection signal line 12 being connected to the first signal connection line 11, and the other end of the second connection signal line 12 being connected to any one of the plurality of signal lines 101 in the first display area AA1.

The first signal connection lines 11 and the plurality of signal lines 101 in the second display area AA2 are connected to fan-out lines 102 in the first non-display area BB1 and are led out to the bonding area 104 through the fan-out lines 102.

In one embodiment, the plurality of signal lines 101 in the first display area AA1 are set to be connected to the first signal connection lines 11 in the second display area AA2 through the second signal connection lines 12 in the second non-display area BB2, so that at least part of the signal lines 101 in the first display area AA1 can be led out from the second display area AA2 to the first non-display area BB1. Therefore, wiring spaces in areas opposite to the first non-display area BB1 and the first display area AA1 can be saved, and at least border widths of the display panel in the areas can be reduced.

Vertex angles of the display area AA of the display panel may be set at R angles, and an end of the first display area AA1 close to the first non-display area BB1 is designed with an arc-shaped R angle. The display panel shown in FIG. 2 can save the wiring space in the area opposite the first non-display area BB1 and the first display area AA1, so the wiring space in the non-display area near the R angle indicated by an ellipse in a lower left dashed line in FIG. 2 can be saved.

Obviously, in the embodiment of the present disclosure, the vertex angles of the display area AA are not limited to an R angle design mode and may also be a rectangular design mode.

Figure 3:
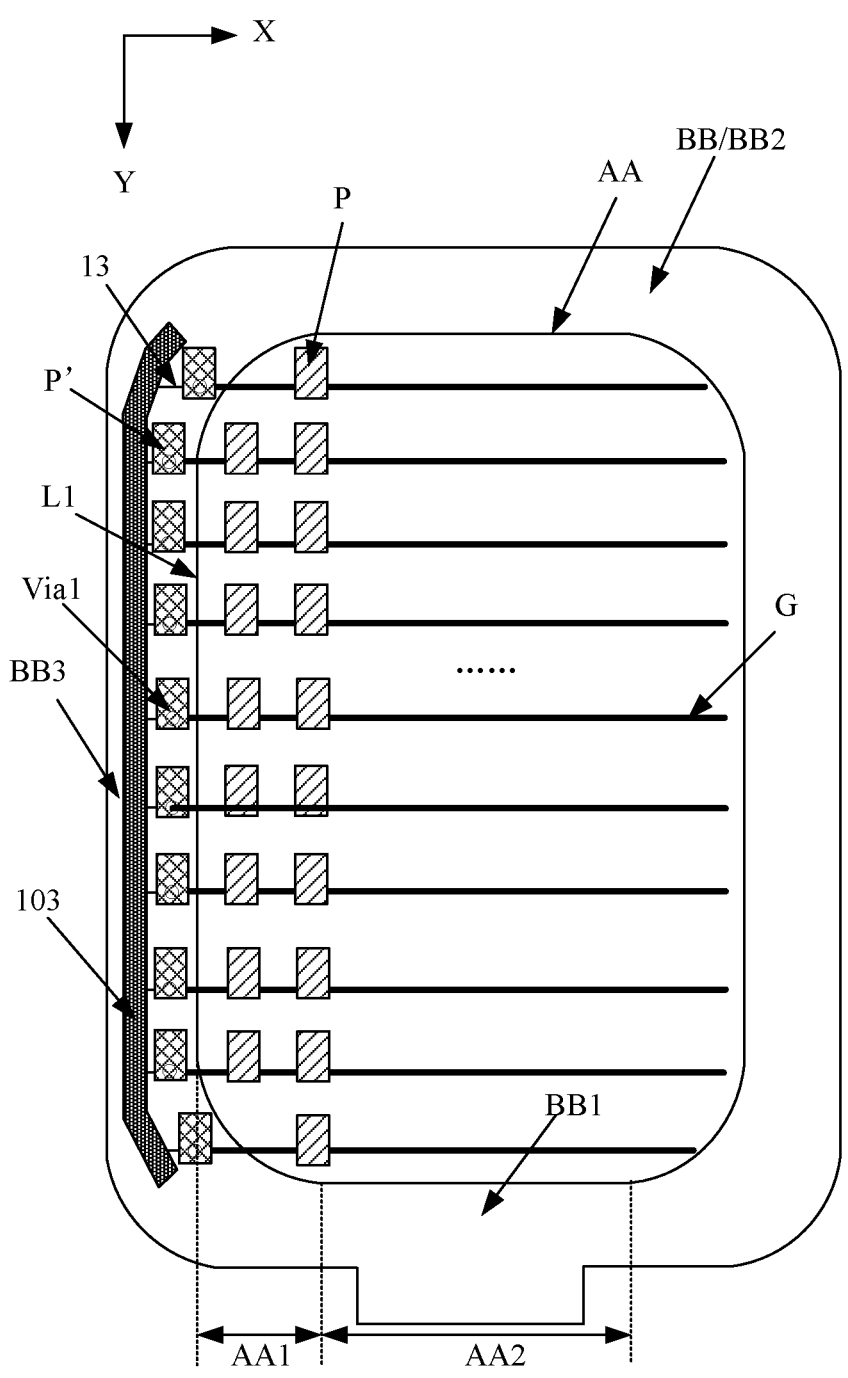
FIG. 3 illustrates a schematic diagram of another display panel consistent with various embodiments of the present disclosure.
Figure 4:
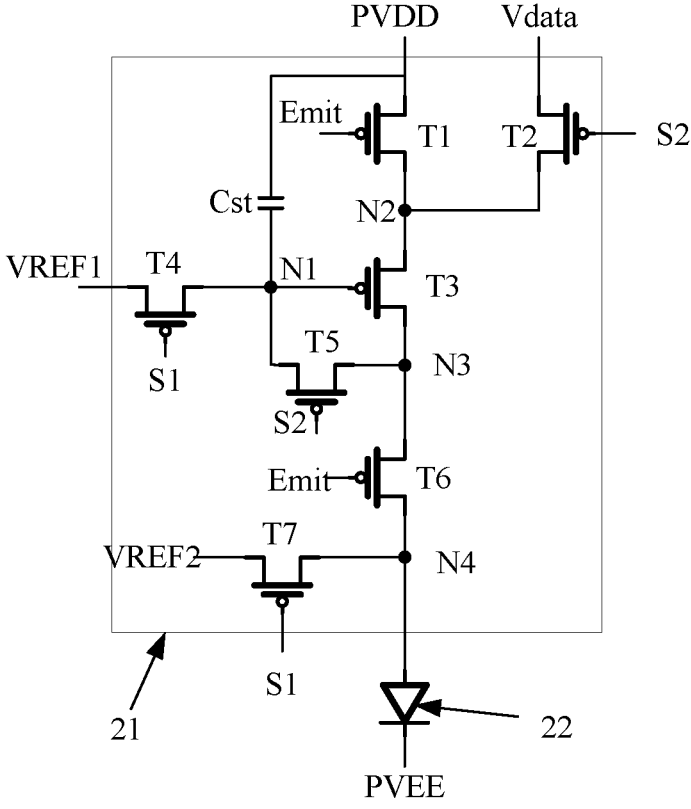
FIG. 4 illustrates a circuit diagram of a display pixel structure in the display panel shown in FIG. 3.
Figure 5:
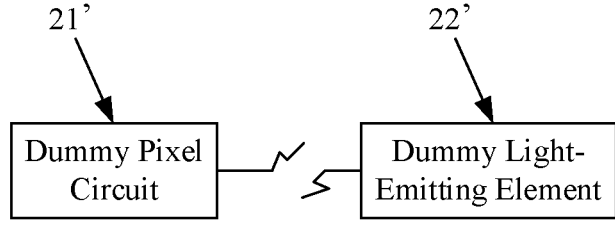
FIG. 5 illustrates a circuit diagram of a dummy pixel structure in the display panel shown in FIG. 3.
Figure 6A:
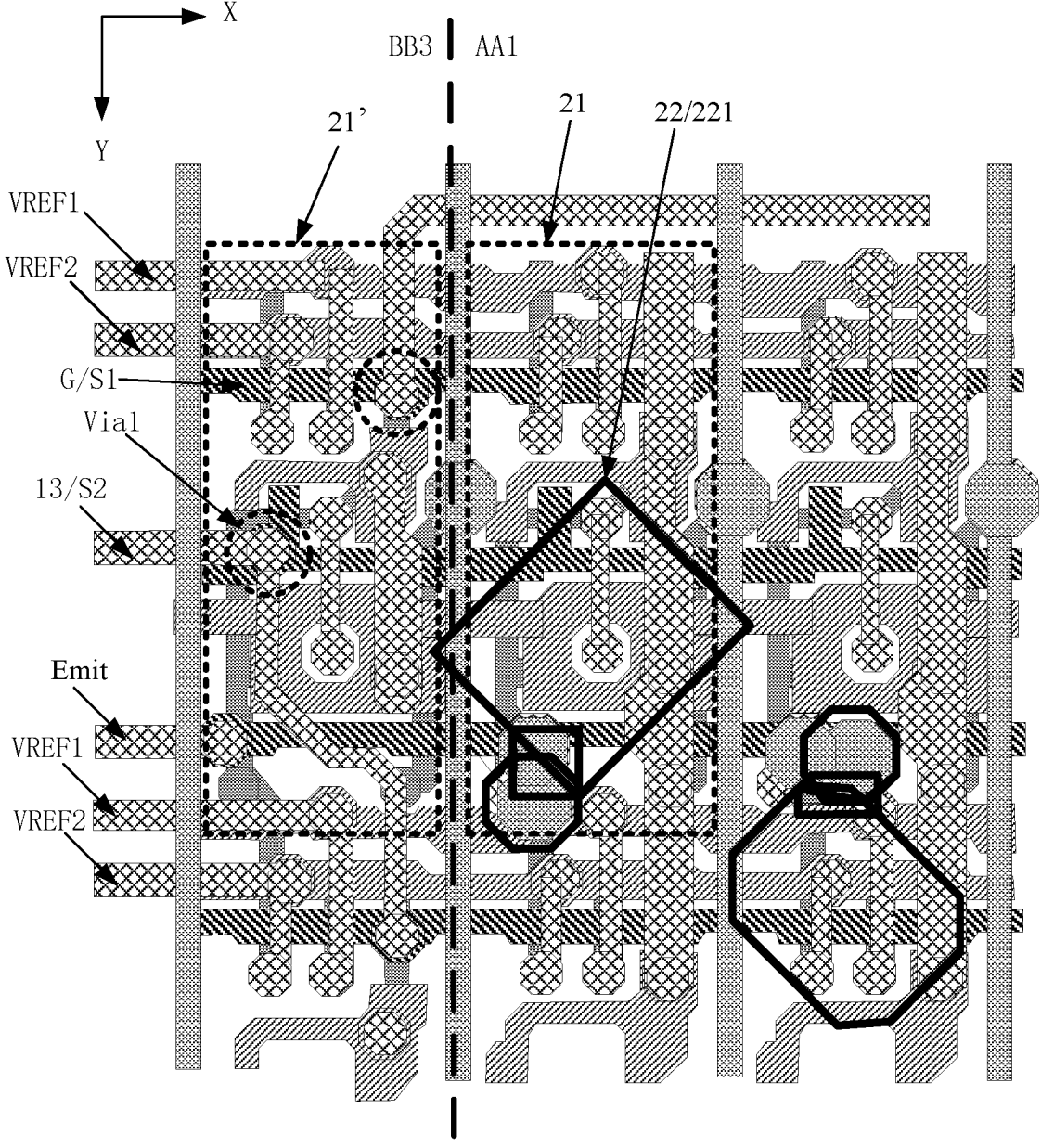
FIG. 6a illustrates a partially enlarged view of the display panel shown in FIG. 3.

FIG. 3 illustrates a schematic diagram of another display panel consistent with various embodiments of the present disclosure. FIG. 4 illustrates a circuit diagram of a display pixel structure in the display panel shown in FIG. 3. FIG. 5 illustrates a circuit diagram of a dummy pixel structure in the display panel shown in FIG. 3. FIG. 6a illustrates a partially enlarged view of the display panel shown in FIG. 3.

Based on the embodiment shown in FIG. 2, in one embodiment shown in FIGS. 3 to 6, the display area AA includes a plurality of display pixel structures P. A display pixel structure P includes a display pixel circuit 21 and a display light-emitting element 22 connected to the display pixel circuit 21. The non-display area BB includes a third non-display area BB3 adjacent to the first side L1, the third non-display area BB3 includes a scan circuit 103, and the scan circuit 103 is connected to a scan line G through a first conductive via "Via1" (a structure shown by the dotted circle in FIG. 6a) to connect the display pixel circuit 21. A plurality of dummy pixel structures P' is arranged in sequence between the scan circuit 103 and the first side L1 along the first direction Y. A dummy pixel structure P' includes a dummy pixel circuit 21' and a dummy light-emitting element 22'. In a direction perpendicular to the display panel, the first conductive via "Via1" is disposed opposite to the dummy pixel circuit 21'.

It should be noted that, to facilitate a illustration clearly, structures including the first signal connection lines 11, the plurality of signal lines 101, the second signal connection lines 12 and the like are not shown in FIG. 3.

The display light-emitting element 22 may be an OLED or a micro LED, and the micro LED may be a Mini LED or a Micro LED, or the like. A specific implementation of the display light-emitting element 22 corresponding to the embodiments of the present disclosure is not limited.

Figure 6B:
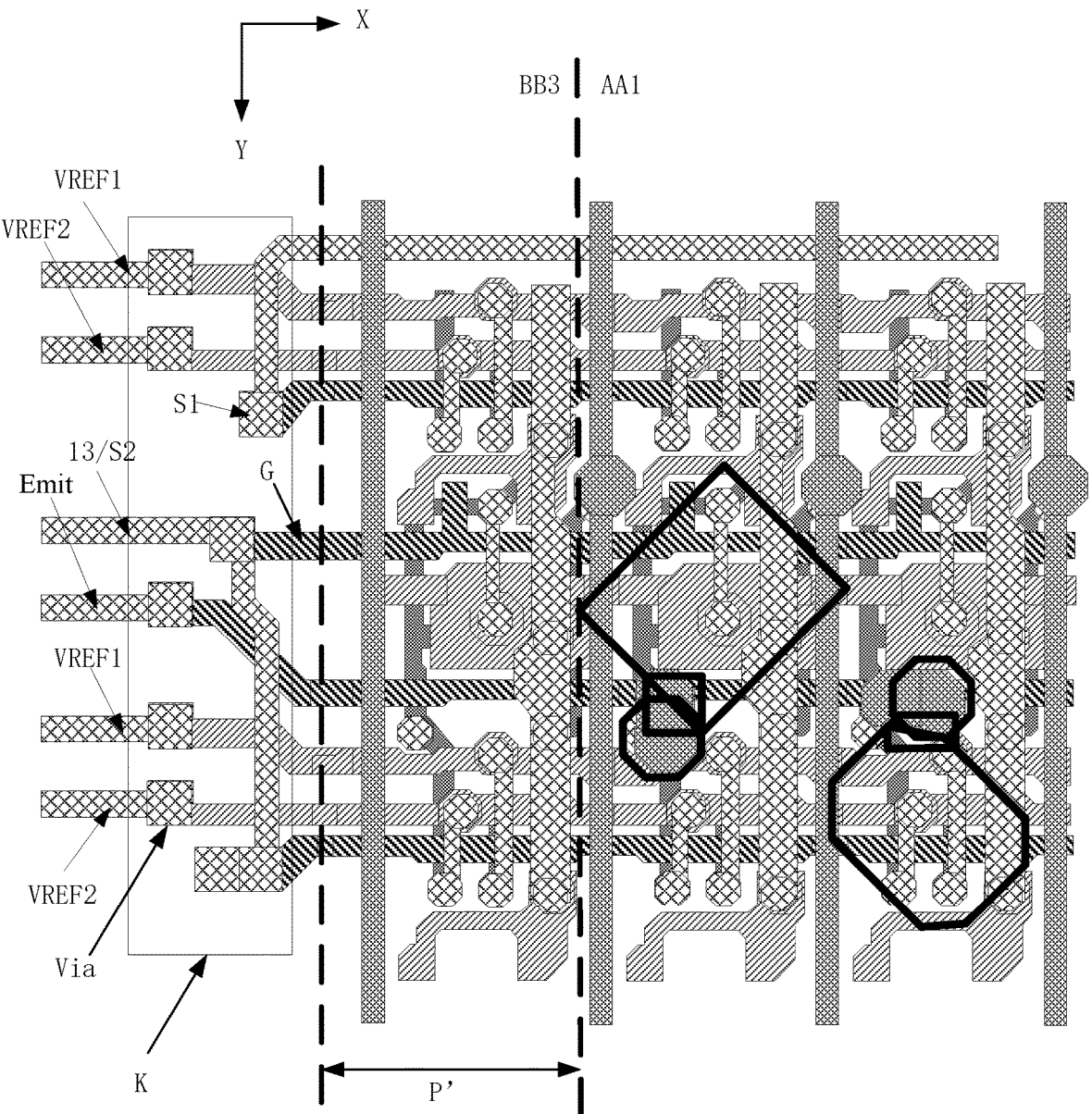
FIG. 6b illustrates a layout diagram of conductive vias for connecting a scan circuit and signal lines in a display area on a conventional display surface.

FIG. 6b illustrates a layout diagram of conductive vias for connecting a scan circuit and signal lines in a display area on a conventional display surface. In combination with FIG. 1 and FIG. 6b, the scan circuit 103 is in the third non-display area BB3 adjacent to the first display area AA1 in the second direction X. The third non-display area BB3 includes a plurality of dummy pixel structures P' arranged in sequence in the first direction Y, and the plurality of dummy pixel structures P' are located between the scan circuit 103 and the first display area AA1. In one embodiment, a wire changing hole area K needs to be disposed between the scan circuit 103 and the plurality of dummy pixel structures P' for disposing wire changing holes "Via" (rectangular conductive vias shown as rectangles in FIG. 6b). Third signal connection lines 13 connected to the scan circuit 103 are respectively connected to a corresponding wiring in the display area AA through corresponding wire changing holes "Via", to be connected to the display pixel circuit 21 to provide the display pixel circuit 21 with scan signals S1/S2, reference voltage signals VREF1/VREF2, and a light emission control signal Emit.

In the embodiment shown in FIG. 6b, since the wire changing hole area K needs to be disposed between the scan circuit 103 and the plurality of dummy pixel structures P' for disposing the wire changing holes "Via", a border width of the third non-display area BB3 is relatively large.

To reduce the border width of the third non-display area BB3, in one embodiment, the wire changing hole "Via" for connecting the scan circuit 103 and the display pixel circuit 21 is in an area where the plurality of dummy pixel structures P' is located. Specifically, in the direction perpendicular to the display panel, the wire changing holes "Via" are arranged opposite to the dummy pixel circuit 21' in the plurality of dummy pixel structures P', so that the wire changing hole area K in FIG. 6b can be saved and the border width of the third non-display area BB3 can be reduced.

In one embodiment, the scan circuit 103 is respectively connected to the display pixel circuit 21 through corresponding third signal connection lines 13. The scan circuit 103 provides the display pixel circuit 21 with the scan signals S1/S2, the reference voltage signal VREF1/VREF2, and the light emission control signal Emit through the corresponding third signal connection lines 13.

The wire changing holes "Via" include a first conductive via "Via1" used by the scan circuit 103 to connect with the scan line G. In contrast to a way that the first conductive via "Via1" connecting the scan circuit 103 to the scan line G is arranged between a dummy pixel structure P' in FIG. 6b, in a technical solution of the present disclosure, the first conductive via "Via1" and the dummy pixel circuit 21' are arranged opposite to each other in the direction perpendicular to the display panel, and a space of the dummy pixel structure P' is reused to arrange the first conductive via "Via1", so that the border width of the third non-display area BB3 can be reduced.

In one embodiment, at least one of a wire changing hole "Via" corresponding to a scan signal S1 in the scan circuit 103, a wire changing hole "Via" corresponding to a scan signal S2 in the scan circuit 103, a wire changing hole "Via" corresponding to the reference voltage signal VREF1 in the scan circuit 103, a wire changing hole "Via" corresponding to the reference voltage signal VREF2 in the scan circuit 103, and a wire changing hole "Via" corresponding the light-emitting control signal Emit in the scan circuit 103 is arranged opposite to the dummy pixel circuit 21' in the dummy pixel structure P'.

As shown in FIG. 4, the display pixel circuit 21 includes a plurality of transistors and a storage capacitor Cst. In FIG. 4, a 7T1C pixel circuit structure is taken as an example for description. The 7T1C pixel circuit structure includes seven pixel transistors T1-T7 and one storage capacitor Cst.

The pixel transistor T3 is a driving transistor. A gate of the pixel transistor T3 is connected to a first node N1, a first electrode of the pixel transistor T3 is connected to a second node N2, and a second electrode of the pixel transistor T3 is connected to a third node N3. The pixel transistor T2 is configured for writing a data voltage DATA. a gate of the pixel transistor T2 is connected to the scan signal S2, a first electrode of the pixel transistor T2 is connected to the data voltage DTAT, and a second electrode of the pixel transistor T2 is connected to the second node N2. The pixel transistor T1 is a control transistor, a gate of the pixel transistor T1 is input with the light emission control signal Emit, a first electrode of the pixel transistor T1 is connected to a positive power supply voltage PVDD and is connected to the first node N1 through the storage capacitor Cst, and a second electrode of the pixel transistor T1 is connected to the second node N2. The pixel transistor T4 is configured for voltage reset of the first node N1, a gate of the pixel transistor T4 is connected to the scan signal S1, a first electrode of the pixel transistor T4 is connected to the reference voltage VREF1, and a second electrode of the pixel transistor T4 is connected to the first node N1. The pixel transistor T5 is a threshold compensation transistor, a gate of the pixel transistor T5 is input with the scan signal S2, a first electrode of the pixel transistor T5 is connected to the first node N1, and a second electrode of the pixel transistor T5 is connected to the third node N3. The pixel transistor T6 is a control transistor, a gate of the pixel transistor T6 is input with the light-emitting control signal Emit, a first electrode of the pixel transistor T6 is connected to the third node N3, and a second electrode of the pixel transistor T6 is connected to a fourth node N4. The fourth node N4 is configured for connecting an anode of the display light-emitting element 22, and a cathode of the display light-emitting element 22 is connected to a negative power supply voltage PVEE. The pixel transistor T7 is configured for voltage reset of the anode of the display light-emitting element 22, a gate of the pixel transistor T7 is connected to the scan signal S1, a first electrode of the pixel transistor T7 is connected to the reference voltage VREF2, and a second electrode of the pixel transistor T7 is connected to the fourth node N4.

Obviously, an implementation of the display pixel circuit 21 can be selected as required and is not limited to the 7T1C pixel circuit structure shown in FIG. 4 but can also be an 8T1C pixel circuit structure including eight pixel transistors and one storage capacitor, or a 6T1C pixel circuit structure including six pixel transistors and one storage capacitor, or the like, which is not limited herein. The pixel circuit 21 is electrically connected to an anode 221 of the display light-emitting element 22 through a via hole.

The dummy pixel structure P' is disposed in the non-display area BB adjacent to the display area AA. As shown in FIG. 5, since the dummy light-emitting element 22' in the dummy pixel structure P' does not need to emit light for display, a circuit between the dummy pixel circuit 21' and the dummy light-emitting element 22' is disconnected. The dummy light emitting element 22' may be provided without an anode so that the circuit between the dummy pixel circuit 21' and the dummy light emitting element 22' is disconnected.

Since the dummy pixel circuit 21' does not need to perform display control, the dummy pixel circuit 21' may have a same structure as the display pixel circuit 21, or part of a transistor layout is reduced based on a circuit of the display pixel circuit 21, and the dummy pixel circuit 21' does not need to input and output electrical signals.

As shown in FIG. 6a, the dummy pixel circuit 21' includes a plurality of dummy pixel transistors. As shown by the dotted circle area in FIG. 6a, in the direction perpendicular to the display panel, the first conductive via "Via1" at least partially overlaps a gate of the dummy pixel transistor. The scan line G includes the gate of the dummy pixel transistor, and a protruding portion of the scan line G indicated by a dotted circle area in FIG. 6a represents a gate of a dummy pixel transistor.

In one embodiment, the first conductive via "Via1" at least partially overlaps the gate of the dummy pixel transistor, and the first conductive via "Via1" is disposed in an area with a relatively large area of the scan line G, which is convenient for drilling, increases a contact area between the first conductive via "Via1" and the scan line G and reduces a contact resistance. Moreover, the scan line G does not need to extend further to a left side of FIG. 6a at a gate position of the dummy pixel transistor, which can shorten a length of a gate line and reduce the border width of the third non-display area BB3.

As shown in FIG. 3 and FIG. 6a, the scan circuit 103 is connected to the third signal connection line 13 in the third non-display area BB3, and the third signal connection line 13 is connected to the scan line G through the first conductive via "Via1".

Figure 7:
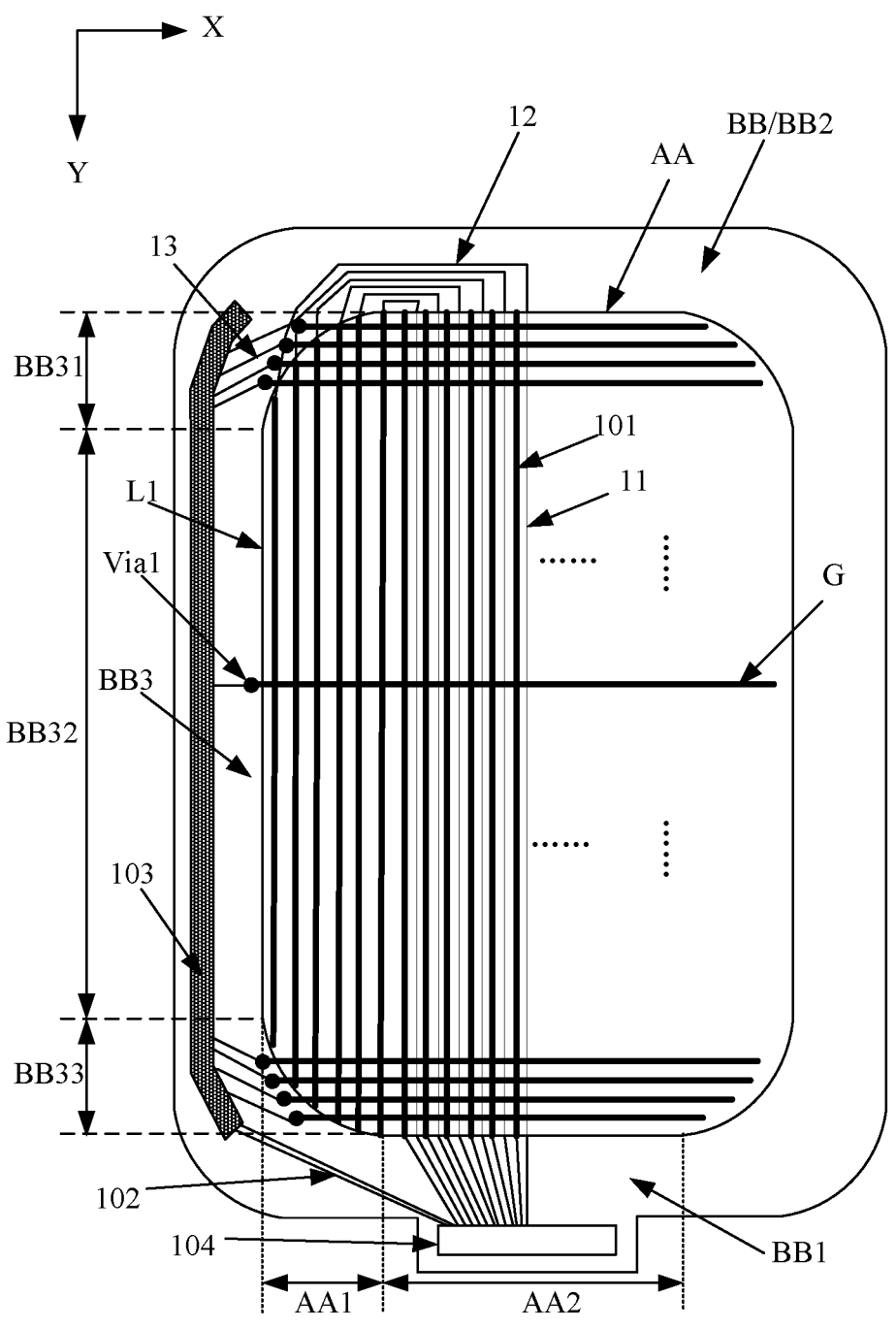
FIG. 7 illustrates a schematic diagram of another display panel consistent with various embodiments of the present disclosure.
Figure 8:
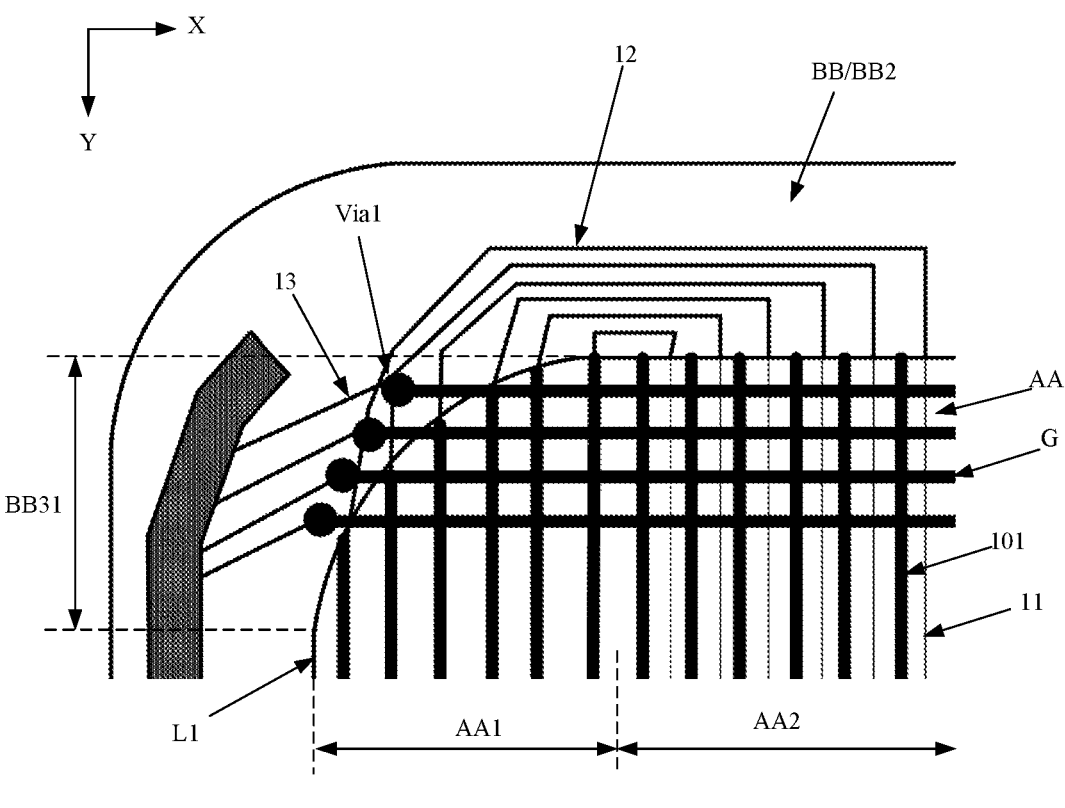
FIG. 8 illustrates a partially enlarged view of a corner area in the display panel shown in FIG. 7.
Figure 9:
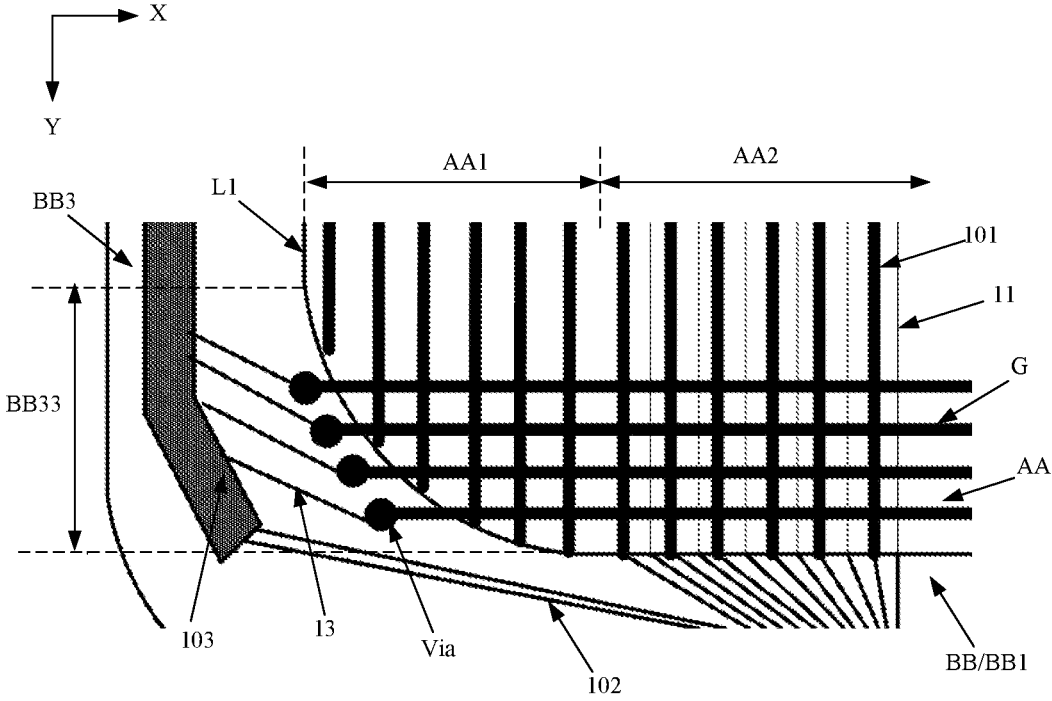
FIG. 9 illustrates a partially enlarged view of another corner area in the display panel shown in FIG. 7.
Figure 10:
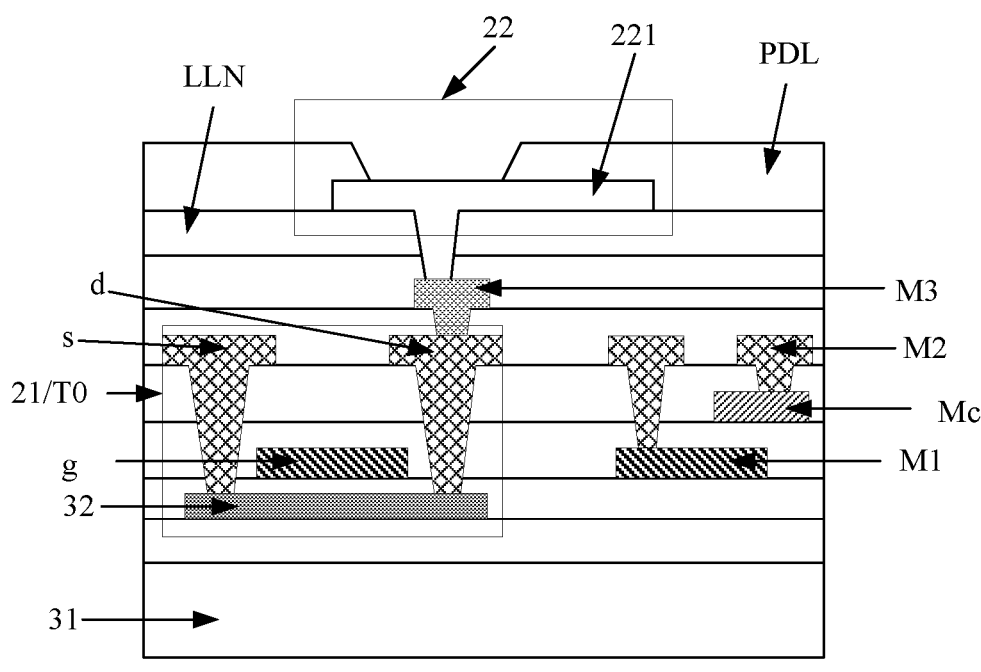
FIG. 10 illustrates a cross sectional view of the display panel shown in FIG. 7.

FIG. 7 illustrates a schematic diagram of another display panel consistent with various embodiments of the present disclosure. FIG. 8 illustrates a partially enlarged view of a corner area in the display panel shown in FIG. 7. FIG. 9 illustrates a partially enlarged view of another corner area in the display panel shown in FIG. 7. FIG. 10 illustrates a cross sectional view of the display panel shown in FIG. 7. FIG. 8 is a partially enlarged view of a region near an upper left R corner in FIG. 7, and FIG. 9 is a partially enlarged view of a region near a lower left R corner in FIG. 7.

As shown in FIGS. 7-9, the display area AA includes a plurality of scan lines G arranged in sequence, and the scan lines G are in a first metal layer M1 and extend along the second direction X. The non-display area BB includes the third non-display area BB3 adjacent to the first side L1, and the third non-display area BB3 includes a scan circuit 103. The third non-display area BB3 includes a first portion BB31, a second portion BB32 and a third portion BB33 that are sequentially arranged along the first direction Y. The scan circuit 103 is connected to the scan lines G through the third signal connection lines 13. In the first portion BB31, the third signal connection lines 13 are on a second metal layer M2, and the first metal layer M1 is different from the second metal layer M2.

In one embodiment, the first metal layer M1 is set to be different from the second metal layer M2, to facilitate a wiring of the second signal connection lines 12 in the second non-display area BB2, so that the third signal connection lines 13 and the second signal connection lines 12 are insulated and crossed on different layers.

In a non-display area at a top corner between the first non-display area BB1 and the third non-display area BB3 (i.e., a non-display area near a lower left corner R in FIG. 7), a conventional design scheme needs to set the scan circuit 103 and the fan-out lines 102 of the signal line 101 in the first display area AA1 at a same time, and also needs to set the third signal connection lines 13 connecting the scan circuit 103 and the scanning lines G. In addition, traces drawn from the second display area AA2 also occupy part of the non-display area at a top corner, resulting in a relatively larger border width in the non-display area at the top corner, which is inconvenient for narrow border design.

In one embodiment, as shown in FIG. 8 and FIG. 9, the signal lines 101 in the first display area AA1 are connected to the second connection signal lines 12 in the second non-display area BB2, the second connection signal lines 12 are connected to the first signal lines 11 in the second display area AA2, and are connected to the fan-out lines 102 in the first non-display area BB1 through the first signal lines 11, so that the signal lines 101 in the first display AA1 do not need to be provided with the fan-out lines 102, which greatly reduces a border width of the non-display area at a lower left corner. At a same time, since the second non-display area BB2 does not need to set the fan-out lines 102, the second non-display area BB2 includes a more sufficient wiring space than the first non-display area BB1. Therefore, setting the second connection signal lines 12 in the second non-display area BB2 will not increase a border width of the second non-display area BB2.

As shown in FIG. 10, the display panel includes a substrate 31 and a transistor T0 on the surface of the substrate 31. The transistor T0 is used as a pixel transistor in the display pixel circuit 21 or a non-pixel transistor in the dummy pixel circuit 21'. The transistor T0 in FIG. 10 is a pixel transistor in the display pixel circuit 21, and the dummy pixel circuit structure is not shown. The substrate 31 may be a soft substrate such as PI (polyimide) or the like. In other embodiments, the substrate 31 can also be a rigid substrate, such as a glass plate or the like. The dummy pixel circuit structure is not shown in FIG. 10.

The transistor T0 includes: an active layer 32; a gate g, a first electrode and a second electrode on a side of the active layer 32 away from the substrate 31. One of the first electrode and the second electrode is a source electrode s, and the other electrode is a drain d. The gate g and the scan line G are both on the first metal layer M1. The first electrode and the second electrode are on the second metal layer M2. The first metal layer M1 is on a side of the second metal layer M2 facing the substrate 31. The substrate 31 includes a plurality of different metal layers configured as electrodes of transistors and wiring required for the display panel. A planarization layer PLN and a pixel definition layer PDL on a surface of the planarization layer PLN are formed on a surface of an uppermost metal layer. The pixel definition layer PDL includes a pixel opening, and the display light-emitting element 22 or the dummy light-emitting element 22' is formed in the pixel opening. An anode 221 of the display light-emitting element 22 is connected to the transistor TO in the display pixel circuit 21 through a via hole.

In one embodiment, the signal lines 101 and the first signal connection lines 11 are all on the third metal layer M3. The fan-out lines 102 are between the bonding area 104 and the display area AA, one part of the fan-out lines 102 is on the first metal layer M1, and the other part of the fan-out lines 102 are on the fourth metal layer Mc. The first metal layer M1, the second metal layer M2, the third metal layer M3 and the fourth metal layer Mc are four different metal layers. At least one of the first metal layer M1, the third metal layer M3 and the fourth metal layer Mc includes the second signal connection lines 12, and the third signal connection lines 13 in the first part BB31 are on the second metal layer M2, so that the third signal connection lines 13 and the second signal connection lines 12 in the first portion BB31 are insulated and crossed on different layers, which facilitates a wiring of the non-display area at a top corner between the third non-display area BB3 and the second non-display area BB2.

Optionally, the first metal layer M1, the third metal layer M3 and the fourth metal layer Mc are all set to include at least one second signal connection line 12. A wiring area of the second signal connection lines 12 can be reduced in the direction parallel to the display panel by wiring the second signal connection lines 12 through three different metal layers. Therefore, a border width of the non-display area at a top corner between the second non-display area BB2 and the third non-display area BB3 and the border width of the second non-display area BB2 are reduced.

In the third non-display area BB3, any third signal connection line 13 in the second portion BB32 and the third portion BB33 is on at least one of the first metal layer M1 to the fourth metal layer Mc. Since in the second portion BB32 and the third portion BB33, there is no requirement for insulation and crossover between the third signal connection lines 13 and the second signal connection lines 12 required in the first portion BB31, the third signal lines 13 in the second portion BB32 and the third portion BB33 may be set on at least one of the first metal layer M1 to the fourth metal layer Mc as required.

To further reduce a border width of the non-display area at a top corner of the display panel between the second non-display area BB2 and the third non-display area BB3, a shape of the second signal connection lines 12 may be adapted to a shape of the top corner.

Figure 11:
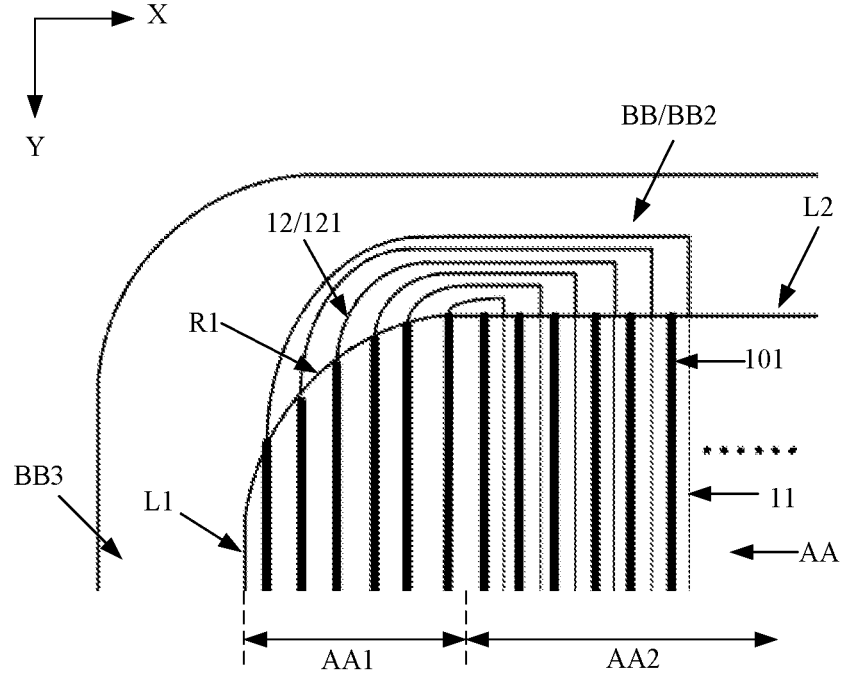
FIG. 11 illustrates a schematic diagram of a wiring method of a display panel in a corner area consistent with various embodiments of the present disclosure.

FIG. 11 illustrates a schematic diagram of a wiring method of a display panel in a corner area consistent with various embodiments of the present disclosure. The non-display area BB includes the third non-display area BB3 adjacent to the first side L1. The display area AA includes the second side L2 adjacent to the second non-display area BB2, and the first side L1 and the second side L2 of the display area AA are connected by a first curve R1 curved toward the display area AA. The second signal connection lines 12 include a second curve 121 connected to the signal line 101, and the second curve 121 is curved toward the display area AA. The second signal connection lines 12 include the second curve 121 that matches a shape of the first curve R1, which facilitates a wiring of the second signal connection lines 12 in the non-display area of vertex corners and reduces a border width of the non-display area at adjacent vertex corners of the non-display area BB and the first curve R1.

Figure 12:
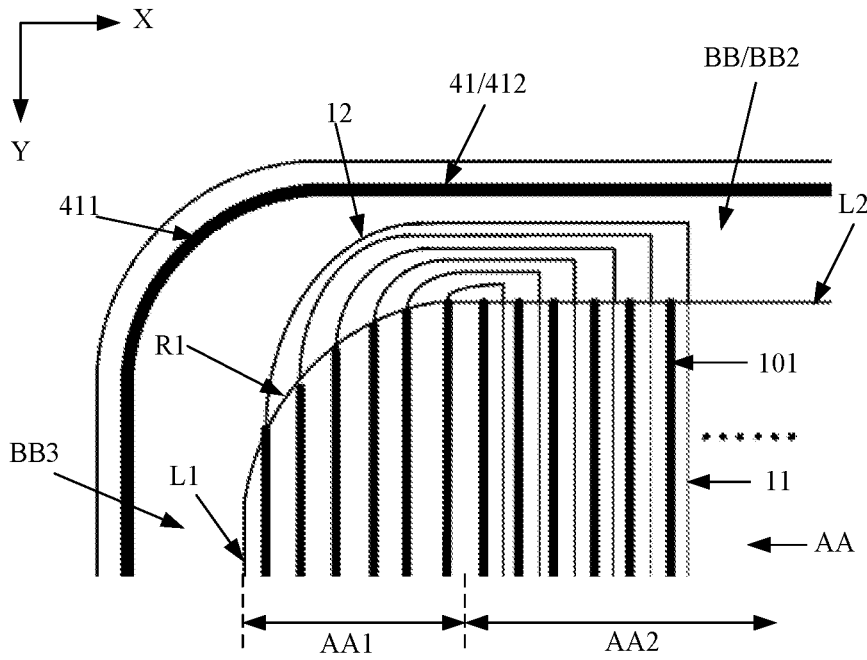
FIG. 12 illustrates a schematic diagram of another wiring method of a display panel in a corner area consistent with various embodiments of the present disclosure.

FIG. 12 illustrates a schematic diagram of another wiring method of a display panel in a corner area consistent with various embodiments of the present disclosure. The non-display area BB includes the third non-display area BB3 adjacent to the first side L1. The display area AA includes the second side L2 adjacent to the second non-display area AA2, and the first side L1 and the second side L2 of the display area AA are connected by the first curve R1 curved toward the display area AA. The non-display area includes a first power signal line 41, and the first power signal line 41 at least surrounds the second side and the first curve. A portion 411 of the first power signal line 41 opposite to the first curve R1 and a portion 412 of the first power signal line 41 opposite to the second side L2 satisfy a same line width condition.

The portion 411 and the portion 412 of the first power signal line 41 satisfy the same line width condition, which means that line widths of the two portions do not exceed a set threshold, so that the line widths of the two portions are same or approximately same. The set threshold can be set as required, e.g., the threshold does not exceed 1000 microns. By setting the portion 411 of the first power signal line 41 opposite to the first curve R1 and the portion 412 opposite to the second side L2 to satisfy the same line width condition, a problem that a line width of the portion 411 of the first power signal line 41 opposite to the first curve R1 is relatively large is avoided, thereby ensuring that the third non-display area BB3 and the second non-display area BB2 have sufficient wiring spaces, and facilitating a wiring of the second connection lines 12 and the third connection lines 103.

The first power supply signal line 41 is used to provide a negative power supply voltage PVEE. In the non-display area BB, a first power supply signal line 41 surrounding at least part of the display area AA is provided, which can not only provide the negative power supply voltage PVEE for the display pixel circuit 21 in the display area AA through the first power supply signal line 41, but also reuse the first power supply signal line 41 as a protection structure to protect conductive parts inside an enclosed area from static electricity.

In one embodiment, in the display area AA, a wiring pitch in an edge area is smaller than a wiring pitch in a middle area. In the display area AA, an area close to the non-display area BB includes a smaller wiring pitch, which can facilitate a wiring in the non-display area at a top corner. If the display area adopts a R angle design, the wiring space of the non-display area near an R angle can be reduced, thereby reducing a border width of the non-display area near the R angle.

On a premise that the wiring pitch in the middle display area is kept constant, reducing the wiring pitch in the edge area includes reducing a wiring pitch of the signal lines 101 near edges of the display area AA, and/or reducing a wiring pitch of the scan lines G near edges of the display area AA.

Figure 13:
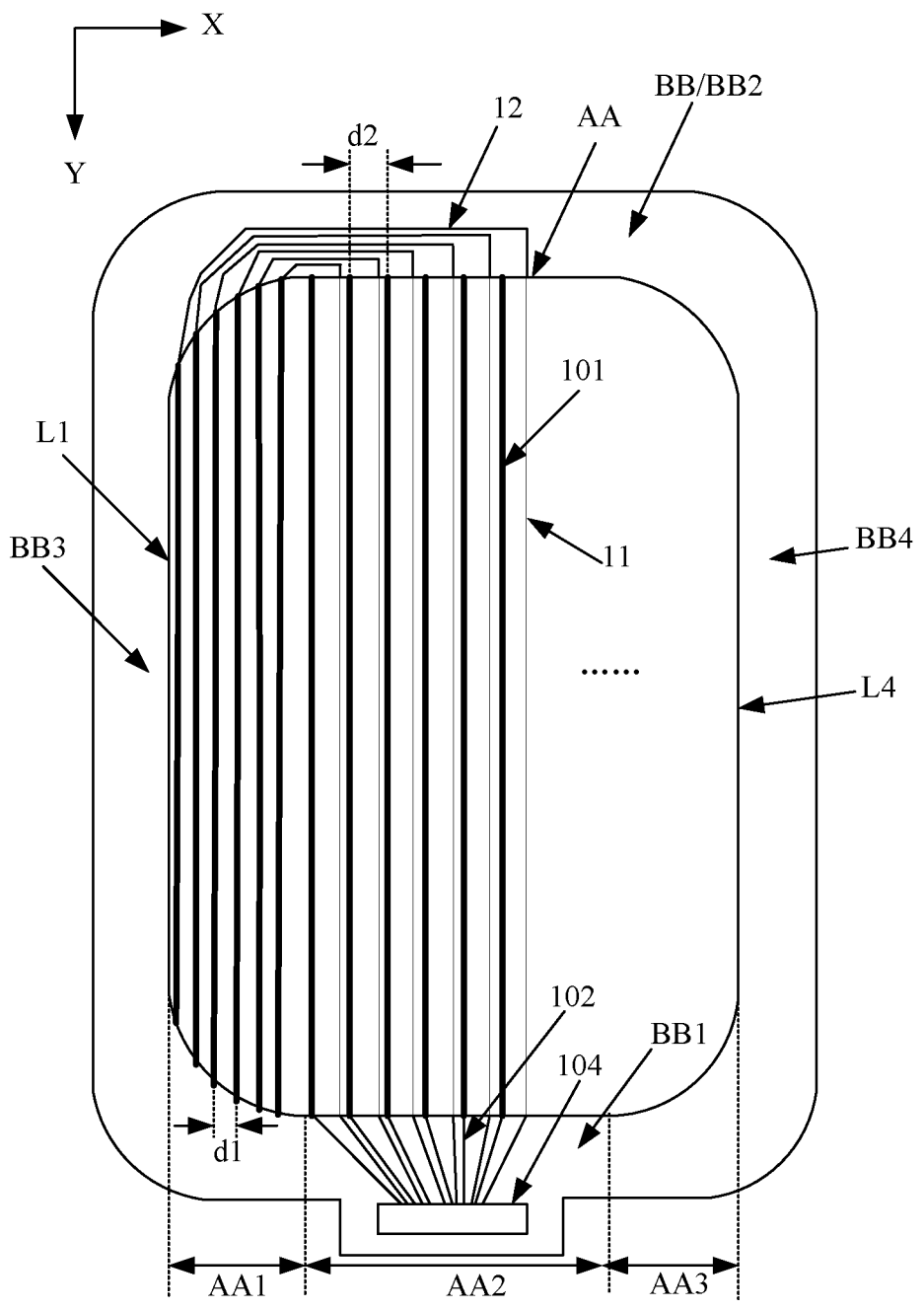
FIG. 13 illustrates a schematic diagram of another display panel consistent with various embodiments of the present disclosure.

FIG. 13 illustrates a schematic diagram of another display panel consistent with various embodiments of the present disclosure. Based on the above embodiment, in one embodiment shown in FIG. 13, in the first display area AA1, at least part of the signal lines 101 have a first pitch d1. In the second display area AA2, the signal lines 101 have a second pitch d2. The first pitch d1 is smaller than the second pitch d2. In the embodiment, in the second direction X, the wiring pitch of the signal lines 101 in the display area AA close to the non-display area BB is reduced.

In the second display area AA2, a pitch of the signal lines 101 is the second pitch d2, so that the signal lines 101 in the second display area AA2 can be wired with a uniform wiring pitch. In the first display area AA1, a pitch of the signal lines 101 may be the first pitch d1, so that the signal lines 101 in the first display area AA1 can be wired with a uniform wiring pitch.

In other embodiments, part of the signal lines 101 in the first display area AA1 close to the first side L1 may have the first pitch d1, and another part of the signal lines 101 in the first display area AA1 close to the second display area AA2 may have the second pitch d2. Therefore, the part of the signal lines 101 in the first display area AA1 close to the first side L1 can be wired with a uniform first pitch d1, and the other part of the signal lines 101 close to the second display area AA2 can be wired with the signal lines 101 in the second display area AA2 at a uniform second pitch d2.

It should be noted that, in the above embodiment, only the wiring pitch of the signal lines 101 in the first display area AA1 close to the first side L1 and a scheme of connecting the second signal connection lines 12 and the first signal connection lines 11 are used for illustration. Obviously, the signal lines 101 in a third display area AA3 on a side of the second display area AA2 away from the first display area AA1 can also adopt the wiring pitch of the signal lines 101 in the first display area AA1 and the scheme of connecting the second signal connection lines 12 and the first signal connection lines 11, which is not shown herein.

The display area AA includes a first side L1 and a fourth side L4 opposite to each other in the second direction X. The second display area AA2 is between the first display area AA1 and the third display area AA3. The first display area AA1 includes the first side L1, and the third display area AA3 includes the fourth side L4.

Figure 14:
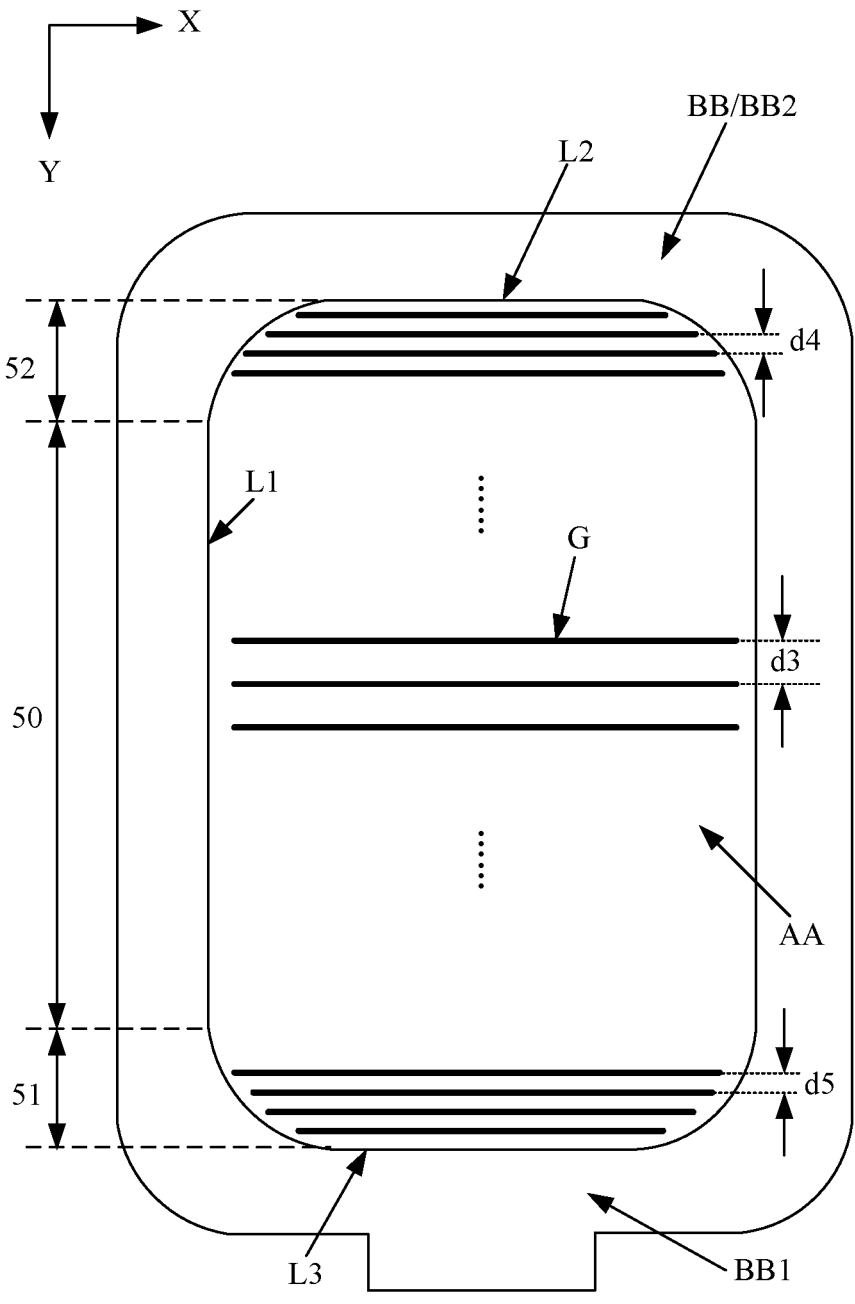
FIG. 14 illustrates a schematic diagram of another display panel consistent with various embodiments of the present disclosure.

FIG. 14 illustrates a schematic diagram of another display panel consistent with various embodiments of the present disclosure. Based on the above embodiment, in one embodiment shown in FIG. 14, the display area AA includes a plurality of scan lines G arranged in sequence, and the scan lines G extend along the second direction X. In the display area AA, in the first direction Y, the scan lines G of the middle area 50 have a third pitch d3.

The display area AA includes the second side L2 adjacent to the second non-display area BB2, and a plurality of continuously arranged scan lines G adjacent to the second side L2 have a fourth pitch d4. The fourth distance d4 is smaller than the third distance d3. And/or, the display area AA includes a third side L3 adjacent to the first non-display area BB1, and a plurality of continuously arranged scan lines G adjacent to the third side L3 have a fifth pitch d5. The fifth distance d5 is smaller than the third distance d3. In the embodiment, in the first direction Y, a wiring pitch of the scan lines G in the display area AA close to the non-display area BB is reduced.

In the first direction Y, the display area AA includes a middle area 50 and a first edge area 51 and a second edge area 52 on two sides of the middle area 50. The first edge area 51 includes a third side L3, and the second edge area 52 includes the second side L2. For a display panel with R corner structures at top corners, in the first direction Y, the first edge area 51 is part of the display area corresponding to the adjacent R corner of the first non-display area BB1, and the second edge area 52 is part of the display area corresponding to the adjacent R corner of the second non-display area BB2.

In the middle area 50, all the scan lines G adopt a wiring pitch of the third pitch d3, so that the scan lines G in the middle area 50 are wired with a uniform wiring pitch.

If the fourth pitch d4 is set to be smaller than the third pitch d3, a wiring pitch of all scan lines G in the second edge area 52 can be set to be d4. Alternatively, the wiring pitch of part of the scanning lines G adjacent to the second side L2 is the fourth pitch d4, and the wiring pitch of another part of the scanning lines G close to the middle area 50 is the third pitch d3, to facilitate a wiring of the scan lines G in the second edge area 52.

If the fifth pitch d5 is set to be smaller than the third pitch d3, a wiring pitch of all scan lines G in the first edge area 51 can be set to be d5. Alternatively, a wiring pitch of part of the scanning lines G adjacent to the third side L3 is the fourth pitch d5, and a wiring pitch of another part of the scanning lines G close to the middle area 50 is the third pitch d3, to facilitate a wiring of the scan lines G in the first edge area 51.

Figure 15:
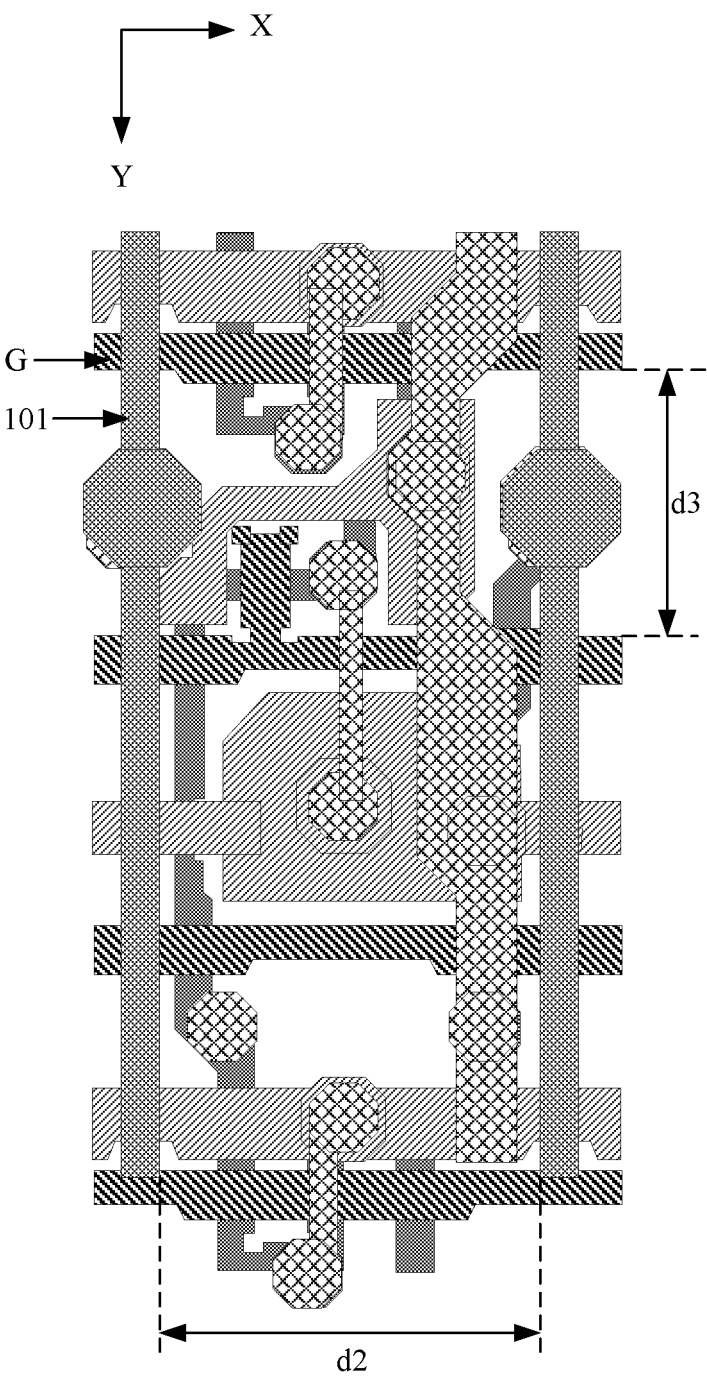
FIG. 15 illustrates a wiring layout of a middle area of a display area consistent with various embodiments of the present disclosure.
Figure 16:
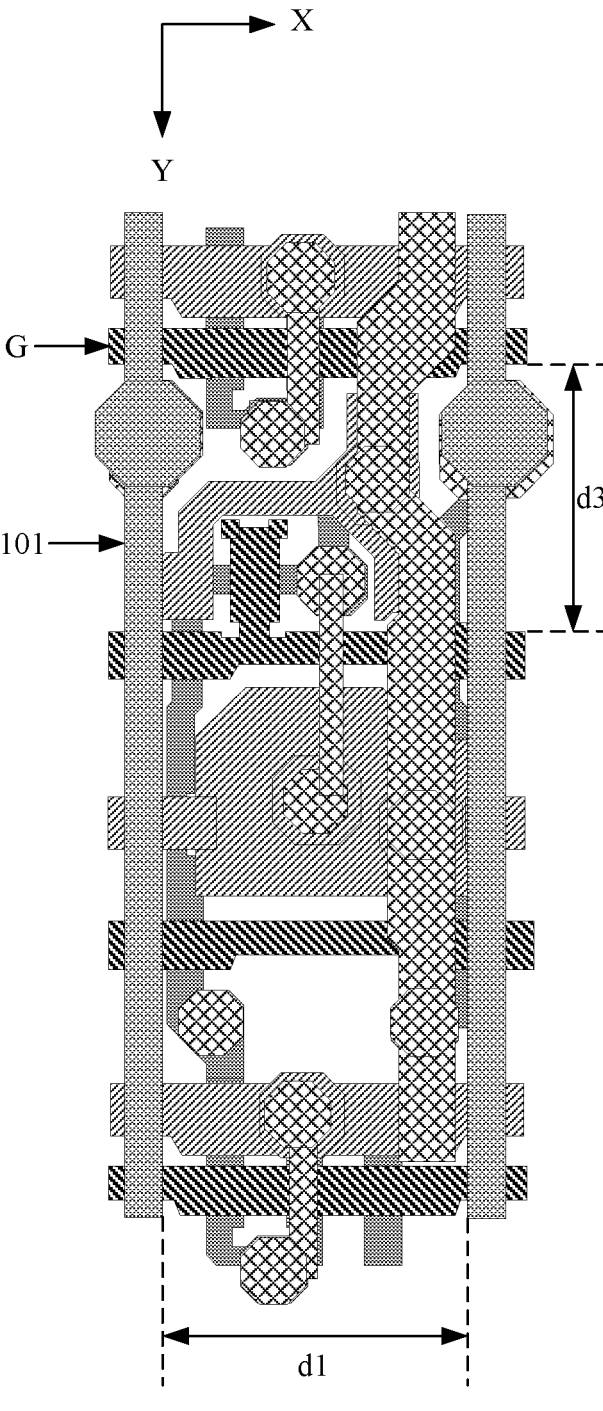
FIG. 16 illustrates a wiring layout of an edge area of a display area consistent with various embodiments of the present disclosure.
Figure 17:
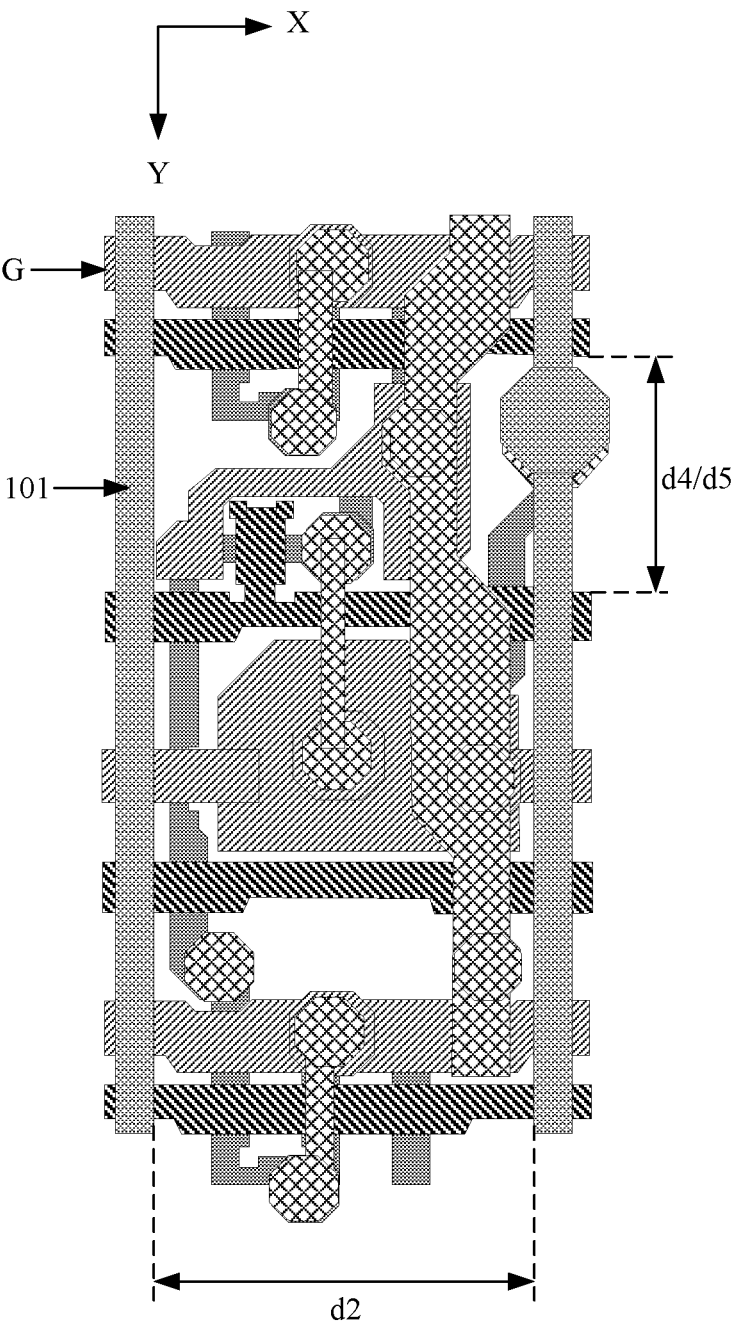
FIG. 17 illustrates another wiring layout of an edge area of a display area consistent with various embodiments of the present disclosure.

In the embodiment shown in FIGS. 13 and 14, when a wiring pitch is reduced in the edge area of the display area AA relative to the middle area, a layout design in the display area AA can be as shown in FIGS. 15-17.

FIG. 15 illustrates a wiring layout of a middle area of a display area consistent with various embodiments of the present disclosure. FIG. 16 illustrates a wiring layout of an edge area of a display area consistent with various embodiments of the present disclosure. FIG. 17 illustrates another wiring layout of an edge area of a display area consistent with various embodiments of the present disclosure.

As shown in FIG. 15, in a middle area of the display area AA, a wiring pitch of the scan lines G is the third pitch d3, and a wiring pitch of the signal lines 101 is the second pitch d2.

As shown in FIG. 16, in an edge area parallel to the second direction X and close to an edge of the display area (e.g., the first side L1 and/or the fourth side L4), a wiring pitch of at least part of the signal lines 101 is the first pitch d1.

As shown in FIG. 17, in an edge area parallel to the first direction and close to an edge of the display area (e.g., the second side L2 and/or the third side L3), a wiring pitch of at least part of the scan lines G is the fourth pitch d4 or the fifth pitch d5. The fourth pitch d4 and the fifth pitch d5 may be same or different. To facilitate a uniform wiring arrangement, the fourth pitch d4 and the fifth pitch d5 may be set to be same.

As shown in FIGS. 15-17, in the display area AA, an edge area and a middle area have same pixel structures P. That is to say, the edge area and the middle area adopt same display light-emitting elements 22 and same display pixel circuits 21. In different areas of the display area AA, sizes of the display light-emitting elements 22 are same, and sizes and layouts of transistors in the display pixel circuits 21 are same. While the wiring pitch is reduced in the edge area relative to the middle area, the pixel structures P are kept unchanged, so that the edge area and the middle area in the display area AA can be fabricated with a same standard, and a fabrication process is simple.

Figure 18:
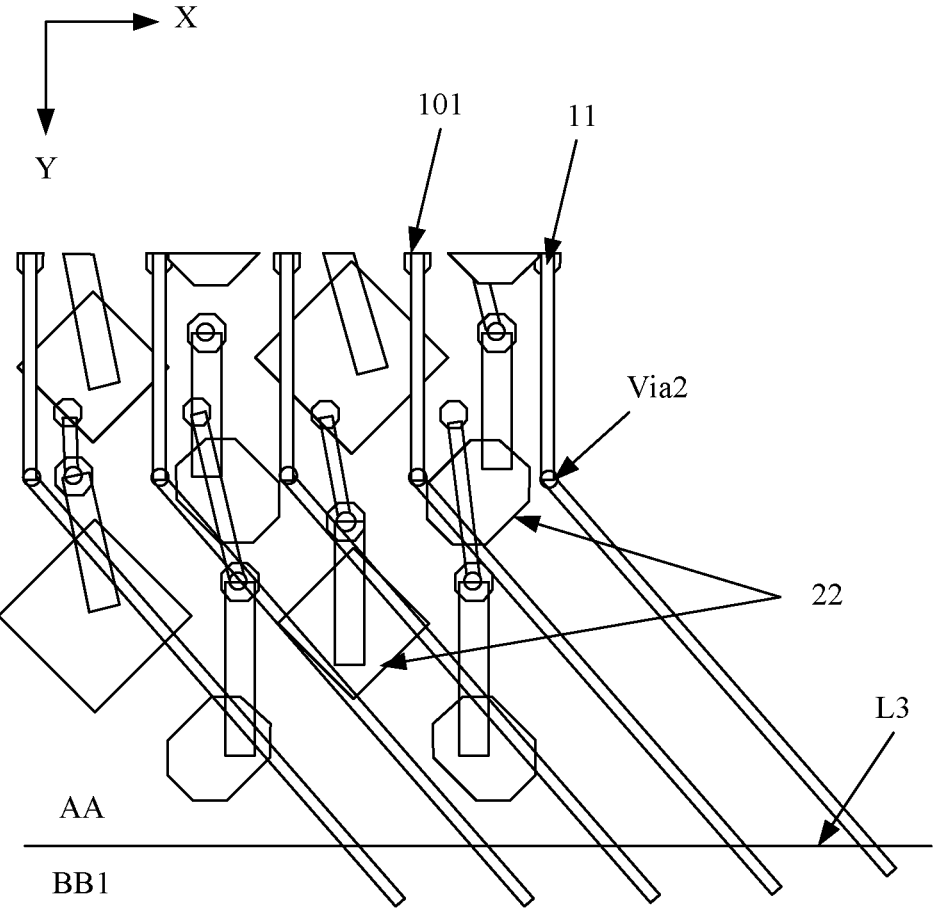
FIG. 18 illustrates a schematic diagram of a wiring method of a display panel in an adjacent area on a third side consistent with various embodiments of the present disclosure.

FIG. 18 illustrates a schematic diagram of a wiring method of a display panel in an adjacent area on a third side consistent with various embodiments of the present disclosure. The first border area BB1 includes a fan-out line 102. The signal line 101 and the first signal connection line 11 pass through the second conductive via Via2 and the corresponding fan-out line 102. The second conductive via hole Via2 is in the display area AA, and the fan-out line 102 extends into the display area AA.

In one embodiment shown in FIG. 18, the fan-out line 102 is extended into the display AA, and the second conductive via Via2 connecting the signal line 101 and the first signal connection line 11 is disposed in the display area AA, so that a length of the fan-out line 102 in the first non-display area BB1 can be shortened, and a border width of the first non-display area BB1 can be reduced.

In the embodiments of the present disclosure, in one manner, as shown in FIG. 2, FIG. 7, FIG. 8, and FIGS. 11-13, the first display area AA1 can be set to include signal lines numbered from a first signal line to an N-th signal line arranged in sequence along the second direction X, and N is a positive integer greater than 1. The second display area AA2 is set to have first N-th first signal connection lines arranged in sequence along the opposite direction of the second direction X. The second non-display area BB2 includes second signal connection lines numbered from a first second signal connection line to an N-th second signal connection line arranged in sequence along the first direction Y. A i-th signal line is connected to a i-th first signal connection line through a i-th second signal connection line, and i is a positive integer not greater than N. In the manner, it is not necessary to extend the first signal connection lines 11 to the second non-display area BB2. The i-th signal line is connected to the i-th first signal connection line through the i-th second signal connection line. The i-th second signal connection line does not need to cross a x-th first signal connection line, which facilitates a wiring of the first signal line connection line 11. x is a positive integer not greater than N, and i≠x.

In the above manner, the signal lines numbered from a first signal line to an N-th signal line in the first display area AA1 are arranged in sequence in the first direction X. The first signal connection lines numbered from a first first signal connection line to an N-th first signal connection line connected to each signal line 101 in the first display area AA1 are arranged in sequence in an opposite direction of the second direction X.

Figure 19:
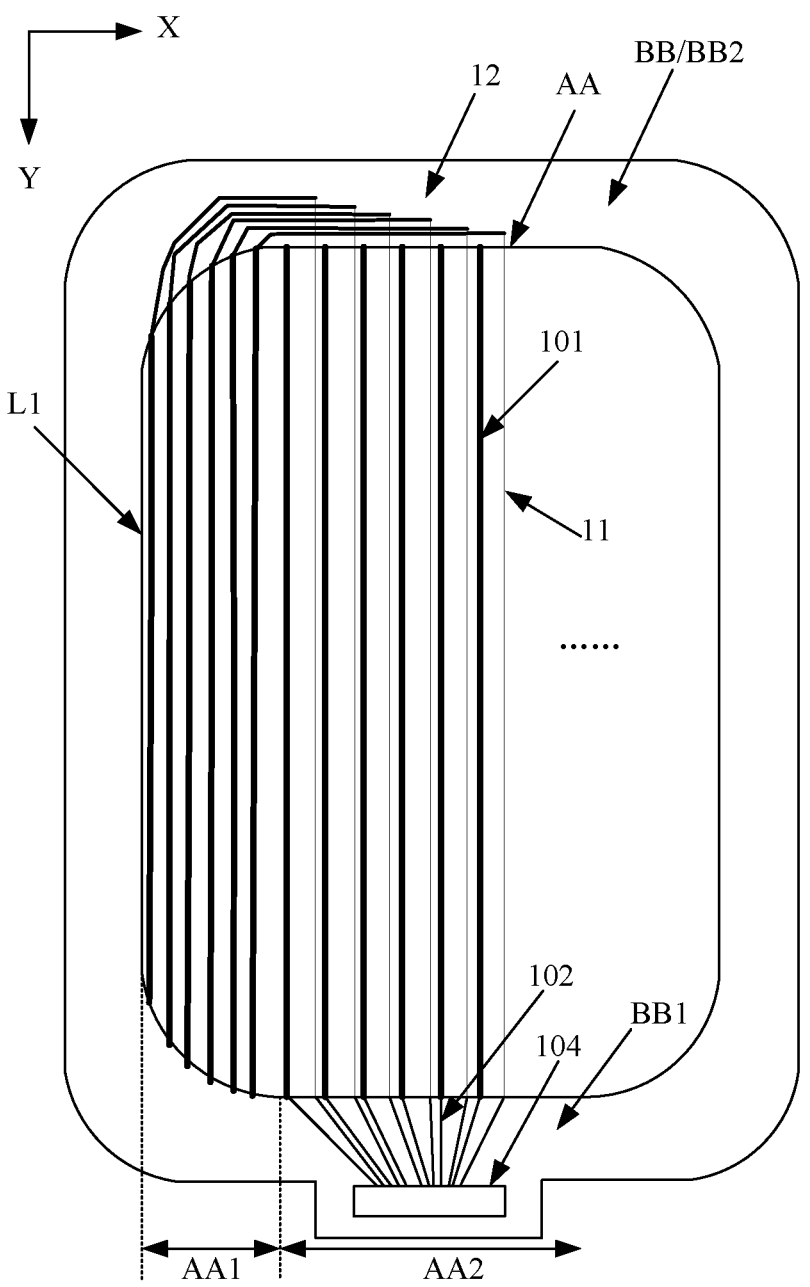
FIG. 19 illustrates a schematic diagram of another display panel consistent with various embodiments of the present disclosure.
Figure 20:
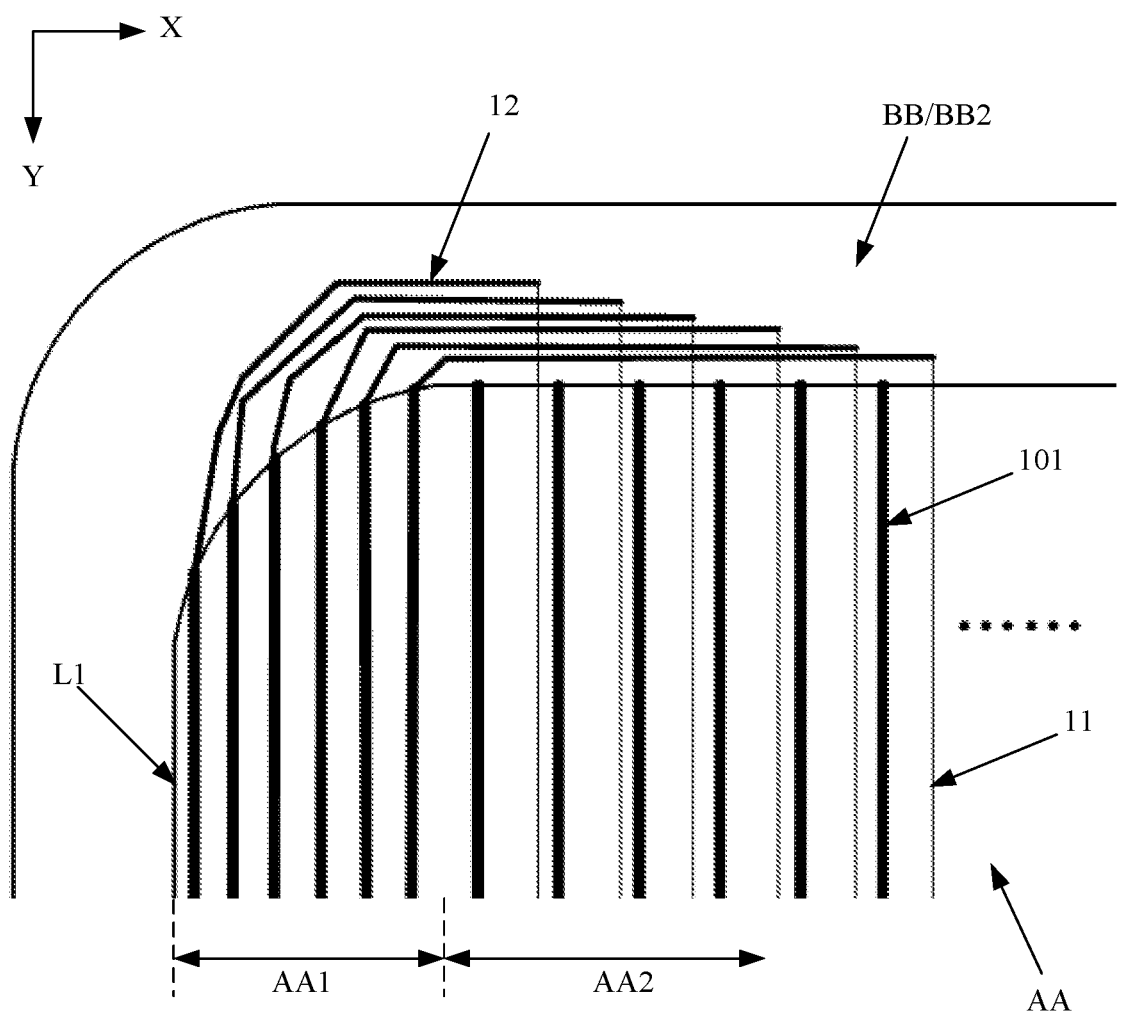
FIG. 20 illustrates a partially enlarged view of the display panel shown in FIG. 19.

FIG. 19 illustrates a schematic diagram of another display panel consistent with various embodiments of the present disclosure. FIG. 20 illustrates a partially enlarged view of the display panel shown in FIG. 19. The first display area AA includes signal lines numbered from a first signal line to an N-th signal line arranged in sequence along the second direction X, and N is a positive integer greater than 1. The signal lines 101 extend to the second non-display area BB2. The second display area AA2 includes first signal connection lines numbered from a first first singal connection line to an N-th first signal connection line arranged in sequence along the second direction X. The second non-display area BB2 includes second signal connection lines numbered from a first second signal connection lines to an N-th second signal connection line arranged in sequence along the first direction Y. A i-th signal line is connected to a i-th first signal connection line through a i-th second signal connection line, and i is a positive integer not greater than N.

In one embodiment shown in FIGS. 19 and 20, the signal lines numbered from a first signal line to an N-th signal line in the first display area AA1 are arranged in sequence in the second direction X. The N pieces of first signal connection lines 11 connected to the N pieces of signal lines 101 are also arranged in sequence in the second direction X, and an order is from the first first signal connection line to the N-th first signal connection line.

In the embodiment shown in FIG. 1, since all the signal lines 101 are arranged in sequence in the second direction X, when the fan-out lines 102 of the first non-display area BB1 are connected to the bonding area, an order of the fan-out lines 102 arranged in sequence in the second direction X is same as an order of the correspondingly connected signal lines 101. A display driver chip disposed in the bonding area can provide data signals for each signal line 101 based on the order.

If the signal lines 101 in the first display area AA1 are connected to the fan-out lines 102 in the second display area AA2 through the first signal connection lines 11 and the second signal-good connection lines 12 and are directly connected to the bonding area 104 through the fan-out lines 102, a port order of the signal line 101 connected to the bonding area 104 will be changed. When a display drive is performed as the embodiment shown in FIG. 1, the display driver chip needs to change and adjust an optical display driver timing based on the port order, so that the display driver timing is adapted to the port order of each signal line 101 leading to the bonding area 104 to perform image display normally.

In other embodiments, line switching can be performed in the first non-display area BB1 and the signal lines 101 in the first display area AA1 are connected to the fan-out lines 102 in the second display area AA2 through the first signal connection lines 11 and the second signal connection lines 12. Through a specific line switching method, a port order of each signal line 101 in the bonding area 104 is same as the port order shown in FIG. 1 without changing a display timing.

Figure 21:
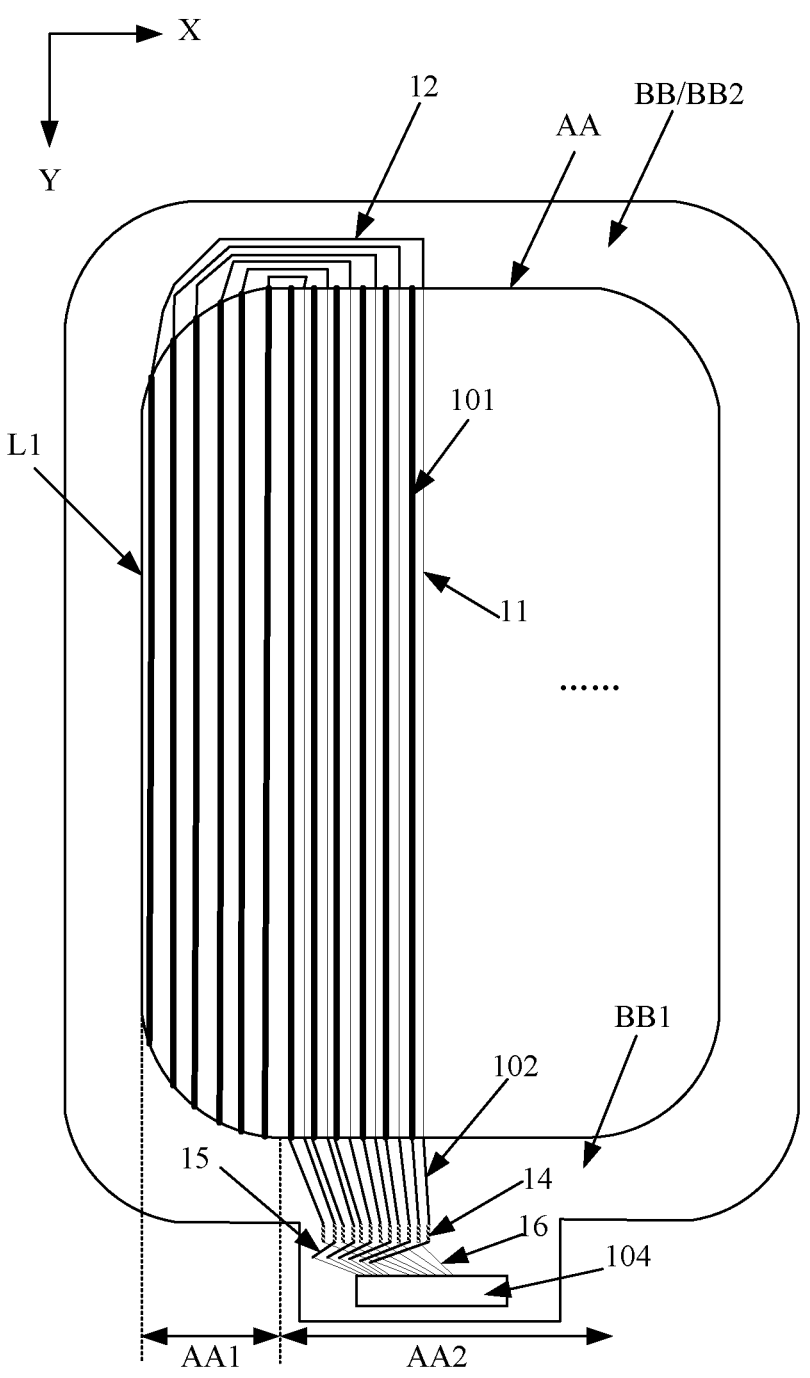
FIG. 21 illustrates a schematic diagram of another display panel consistent with various embodiments of the present disclosure.
Figure 22:
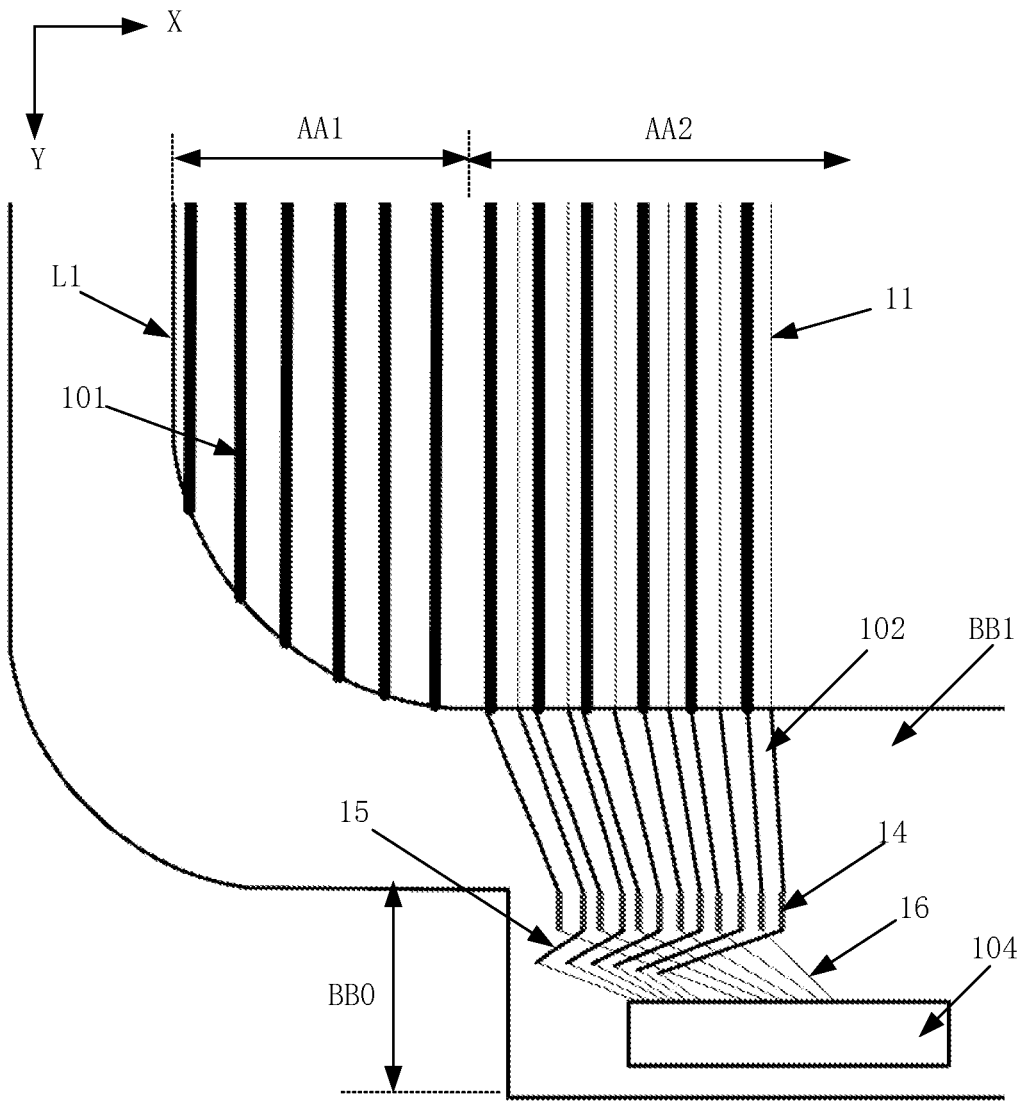
FIG. 22 illustrates a partially enlarged view of the display panel shown in FIG. 21.
Figure 23:
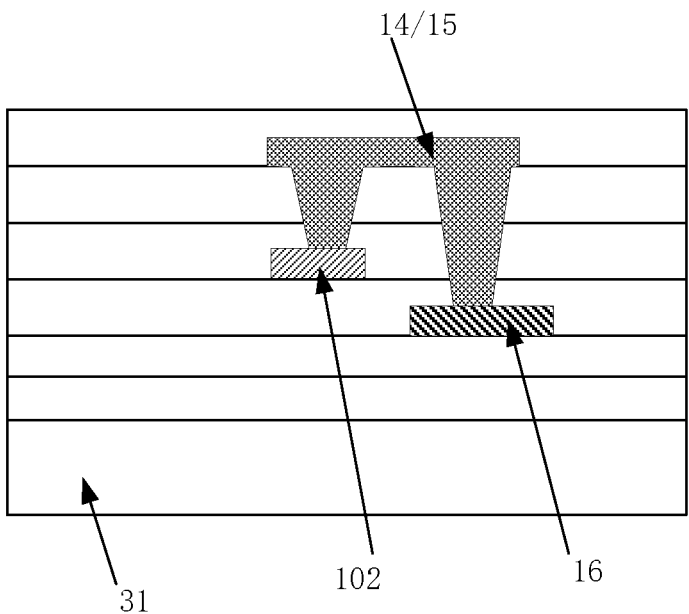
FIG. 23 illustrates a cross-sectional view of the display panel shown in FIG. 21 in a first non-display area.

FIG. 21 illustrates a schematic diagram of another display panel consistent with various embodiments of the present disclosure. FIG. 22 illustrates a partially enlarged view of the display panel shown in FIG. 21. FIG. 23 illustrates a cross-sectional view of the display panel shown in FIG. 21 in the first non-display area. In one embodiment, the first non-display area BB1 includes a plurality of fourth signal connection lines 14 between the bonding area 104 and the display area AA. A plurality of fan-out lines 102 is between the fourth signal connection line 14 and the display area AA. The signal lines 101 and the first signal connection lines 11 are respectively connected to corresponding fourth signal connection lines 14 through different fan-out lines 102. The signal lines 101, the first signal connection lines 11 and the fourth signal connection lines 14 are on a same metal layer and are on a different metal layer from the fan-out lines 102.

In the embodiment shown in FIGS. 21-23, after the signal lines 101 and the first signal connection lines 11 are connected to the fan-out lines 102 in the second display area AA2 and the first non-display area BB1, by changing lines of the fourth signal connection lines 14 on different layers from the fan-out lines 102, a port order of the signal lines 101 connected to the bonding area 104 in the second direction X can be same as a port order of each signal line 101 in the first direction X. Therefore, without changing the port order of each signal line 101 connected to the bonding area 104, the signal lines 101 in the first display area AA1 can be led out from the second display area AA2 to the first non-display area BB1 through the first signal connection lines 11 and the second signal line connection lines 12.

Optionally, fifth signal connection lines 15 and sixth signal connection lines 16 on different layers are between the fourth signal line connection lines 14 and the bonding area 104. Each fourth signal line connection line 14 is connected to the bonding area 104 through a corresponding fifth signal connection line 15 or sixth signal connection line 16. The fifth signal connection lines 15 and the fourth signal connection lines 14 may be on the same metal layer. The sixth signal connection line 16 may be on a same layer as the fan-out lines 102.

In the embodiment, as shown in FIG. 23, the fan-out lines 102 and the sixth signal connection lines 16 may be connected through the fourth signal connection line 14 and the fifth signal connection line 15 on a same layer. As described in the above embodiment, the sixth signal connection lines 16 and the fan-out lines 102 may be on the first metal layer M1 and/or the fourth metal layer Mc, and the fifth signal connection lines 15 and the fourth signal connection lines 14 may be on the third metal layer M3. A piece of fan-out lines 102 on the fourth metal layer Mc is connected to a piece of fourth signal line connection lines 14 and a piece of fifth signal connection lines 15 on the third metal layer M3 through conductive vias. The piece of fourth signal line connection lines 14 and the piece of fifth signal connection lines 15 are connected to a piece of sixth signal connection lines 16 on the first metal layer M1 through conductive vias.

FIG. 23 only illustrates one embodiment of changing the fan-out lines 102. In the embodiment, metal layers where the fan-out lines 102, the fourth signal line connection lines 14, the fifth signal connection lines 15 and the sixth signal connection lines 16 are located may be set as required. In other embodiments, the fan-out lines 102 and the sixth signal connection lines 16 can also be arranged on a same layer, e.g., both the fan-out lines 102 and the sixth signal connection lines 16 are on the first metal layer M1 or on the fourth metal layer Mc.

Part of the first non-display area BB1 away from the display AA is a bending area BB0, and the bending area BB0 can be folded to a back of the display panel to reduce a border width. The bonding area 104 is in the bending area BB0.

As shown in FIG. 21 and FIG. 22, an end of a signal lines 101 in the second display area AA2 and an end of a first signal connection line 11 in the second display area AA2 facing the first non-display area BB1 are respectively connected to a fan-out line 102 at. In the second direction X, the display area AA includes signal lines numbered from a first signal line to a M-th signal line arranged in sequence, the bonding area 104 includes pads numbered from a first pd to a M-th pad arranged in sequence, and M is a positive integer greater than 1. The fan-out lines 102 and the fourth signal connection lines 14 are connected correspondingly through the second conductive vias, so that the j-th signal line is connected to the j-th pad, and j is a positive integer not greater than M. Without changing the port order of each signal line 101 connected to the bonding area 104, the signal lines 101 in the first display area AA1 can be led out from the second display area AA2 to the first non-display area BB1 through the first signal connection lines 11 and the second signal line connection lines 12. A border width between the first non-display area BB1 and an area adjacent to an R corner is reduced without changing a driver timing.

Figure 24:
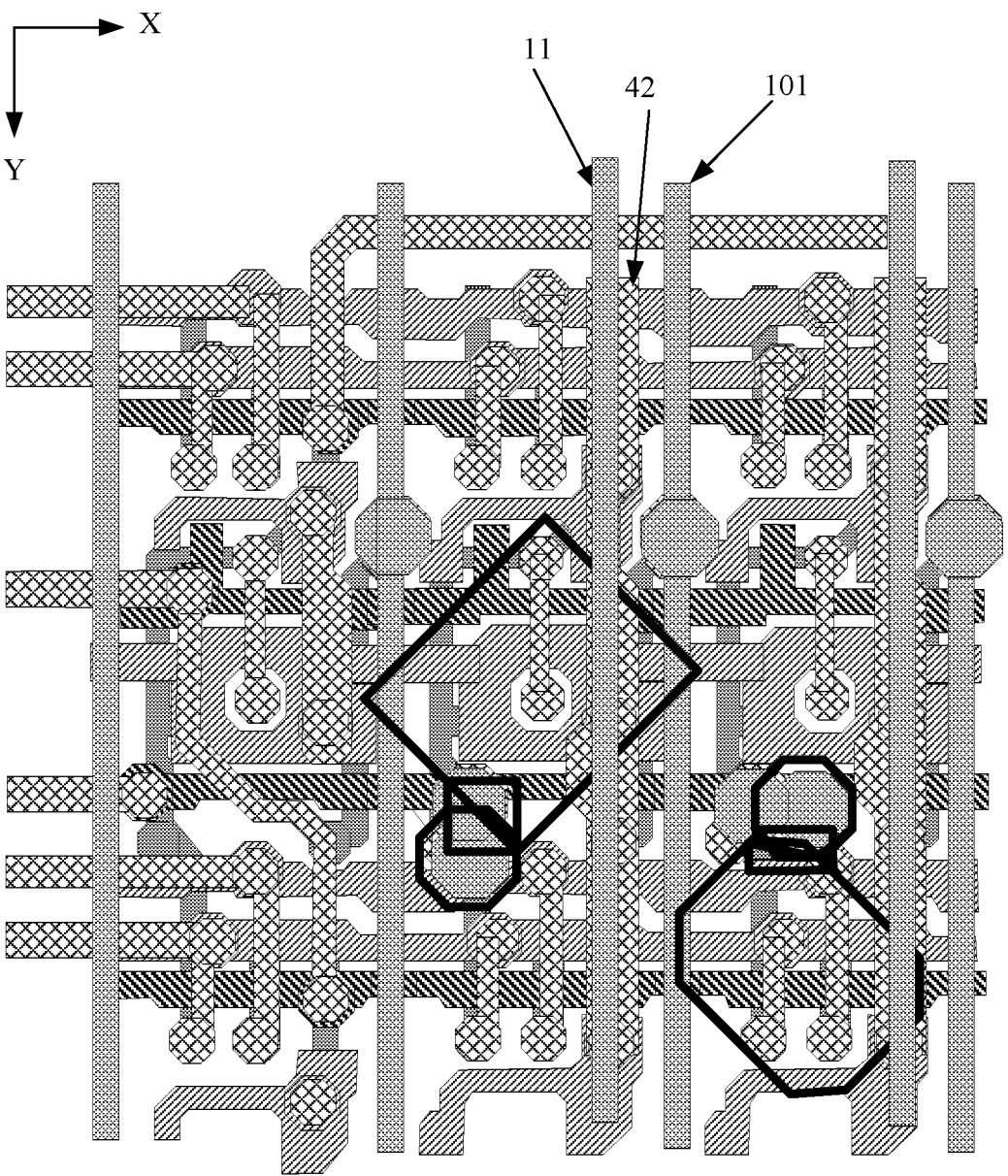
FIG. 24 illustrates a schematic diagram of a wiring principle in a display panel.

FIG. 24 illustrates a schematic diagram of a wiring principle in a display panel. The display area AA includes a plurality of second power signal lines 42 arranged in sequence, and the plurality of second power signal lines 42 extends along the first direction Y. The plurality of second power signal lines 42 is on a different layer from the first signal connection lines 11. In the direction perpendicular to the display panel, a first signal line connection line 11 at least partially overlaps an adjacent second power signal line 42. The plurality of second power signal lines 42 is configured to provide a positive power supply voltage PVDD for the pixel circuit.

In one embodiment, in the direction perpendicular to the display panel, a first signal line connection lines 11 is set to overlap at least part of an adjacent second power signal line 42, so that the first signal connection line 11 can reuse a space above the second power signal line 42 for wiring and reduce a wiring space.

Figure 25:
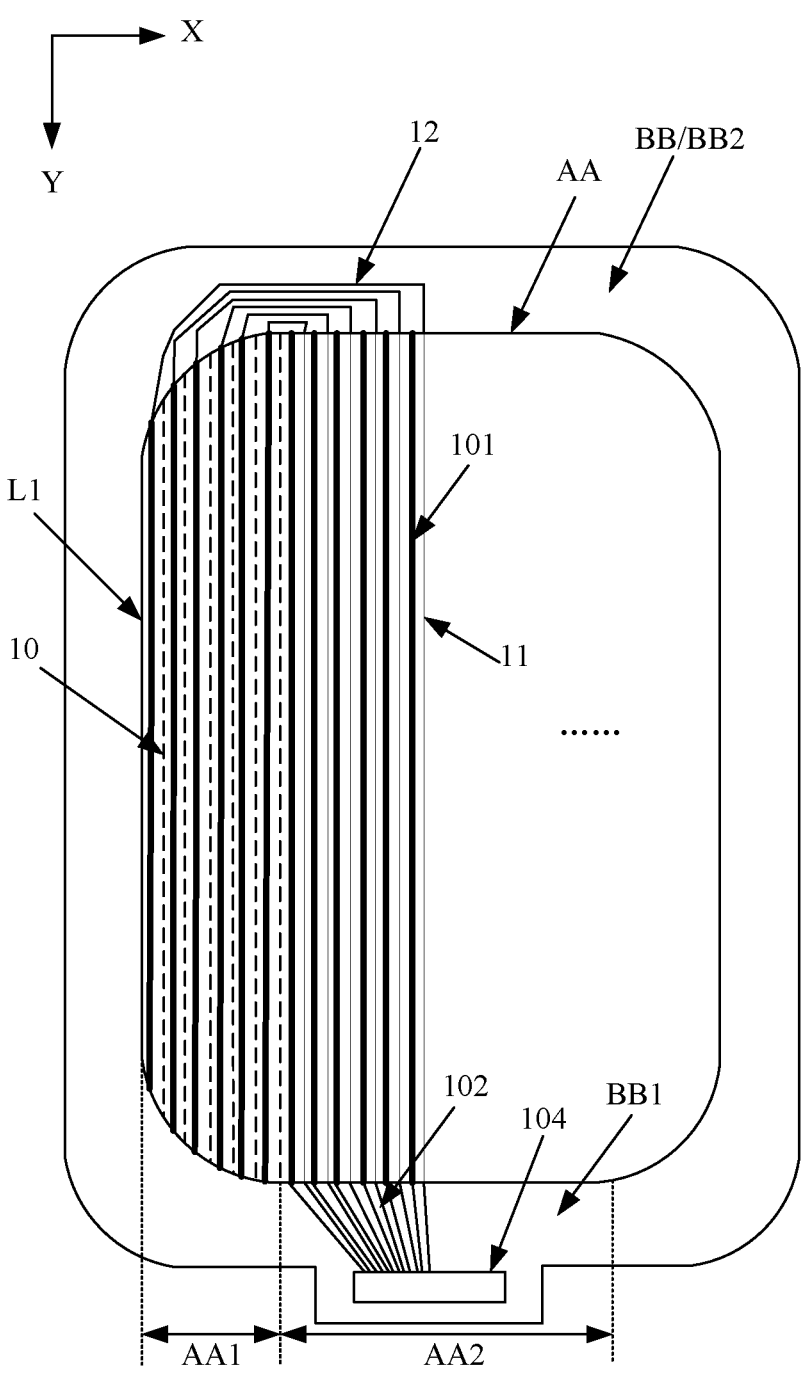
FIG. 25 illustrates a schematic diagram of another display panel consistent with various embodiments of the present disclosure.

FIG. 25 illustrates a schematic diagram of another display panel consistent with various embodiments of the present disclosure. Based on the above embodiment, in one embodiment shown in FIG. 25, the display area AA further includes at least one auxiliary trace 10. The at least one auxiliary trace 10 runs through the display area AA along the first direction Y. Along the second direction X, the at least one auxiliary trace 10 and the first signal connection wires 11 are evenly distributed in the display area AA.

Disposing the first signal connection lines 11 in the second display area AA2 may cause other areas in the display area AA where the first signal connection lines 11 are not disposed to be inconsistent with a flatness of the second display area AA2. Moreover, a difference in wiring density in different areas in the display area AA may also lead to different reflectivities, resulting in a display difference. By arranging the at least one auxiliary trace 10, problems of inconsistent flatness and different reflectivities of the display area AA in different areas can be solved.

Optionally, the at least one auxiliary trace 10 and the first signal connection lines 11 are on a same metal layer, to better solve the problems of inconsistent flatness and different reflectivities of the display area AA in different areas.

In one embodiment, to prevent an inductive electricity generated by a floating potential of the at least one auxiliary trace 10 from affecting performance of the display panel, the at least one auxiliary trace 10 is set to be connected to a fixed potential.

As described in the above embodiments, the display area AA includes display pixel structures P, and a display pixel structure P includes a display pixel circuit 21 and a display light-emitting element 22. The display pixel circuit 21 controls the light-emitting element to emit light based on a first fixed potential and a second fixed potential. The second fixed potential is smaller than the first fixed potential. The at least one auxiliary trace 10 is connected to the first fixed potential or the second fixed potential. One of the first fixed potential and the second fixed potential is the positive power supply voltage PVDD, and the other of the first fixed potential and the second fixed potential is the negative power supply voltage PVEE. The at least one auxiliary trace is input with a fixed voltage signal by using an existing voltage signal in the display panel without separately adding other voltage signals.

Figure 26:
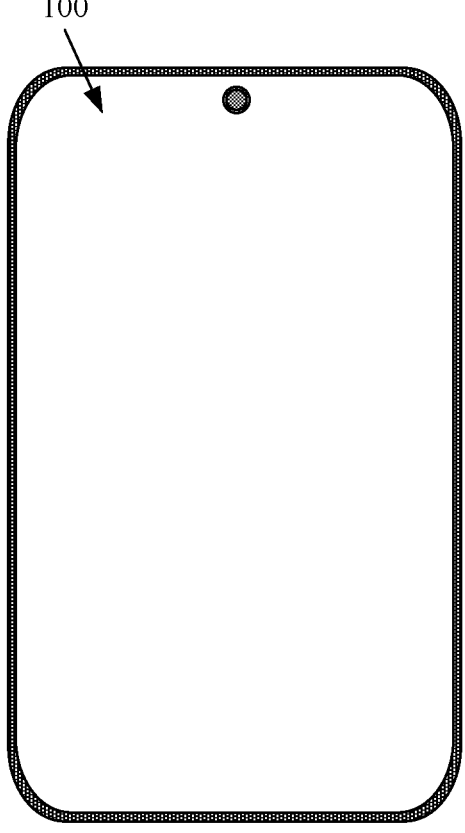
FIG. 26 illustrates a schematic diagram of an electronic device consistent with various embodiments of the present disclosure.

Based on the above embodiments, another embodiment of the present disclosure further provides an electronic device, and the electronic device may be as shown in FIG. 26.

FIG. 26 illustrates a schematic diagram of an electronic device consistent with various embodiments of the present disclosure. The electronic device includes the display panel 100 disclosed in any one of the above embodiments.

In the embodiment, the electronic device may be an active light-emitting display panel such as a smart phone, a tablet computer, a notebook computer, a smart wearable device, and a home appliance with a display function. The electronic device adopts the display panel 100 provided by any one of the above embodiments, which can reduce the border width of the non-display area BB and realize a narrow border design.

In the present specification, each embodiment is described in a progressive manner, or in parallel or in a combination of thereof. Each embodiment focuses on differences from other embodiments, so same and similar parts between various embodiments can be referred to each other. Since the device disclosed in the embodiments corresponds to the method disclosed in the embodiments, the description is relatively simple, and relevant parts can be referred to the description of the method.

It should be noted that, in the description of the present disclosure, an orientation or a positional relationship indicated by the terms "upper", "lower", "top", "bottom", "inner", "outer", etc. is based on the orientation or positional relationship shown in the accompanying drawings, and is only for the convenience of describing the present disclosure and simplified description, rather than indicating or implying that the device or element referred to must have a particular orientation, be constructed and operate in a particular orientation, and therefore should not be construed as limiting the present disclosure. When a component is said to be "connected" to another component, the component can be directly connected to the other component or there may be a centered component at a same time.

It needs to note that in the specification, relationship terms such as first and second are just used to distinguish one entity or operation from another entity or operation but does not necessarily require or suggest that any such actual relationship or sequence exists among these entities or operations. Furthermore, terms of "including", "comprising" or any other variants intend to cover non-exclusive containing, so that an object or a device containing a series of elements not only comprise those elements, but also comprise other elements not listed explicitly, or further comprise elements inherent to such object or device. In the case of no further limitation, an element defined by an expression of "comprising one . . . " does not exclude that there exists additional same element in the process, method, objects, or device comprising the element.

As disclosed, the display panel and the electronic device provided by the present disclosure achieve at least the following beneficial effects.

In the display panel and the electronic device, the signal lines in the first display area are disposed to be connected to the first signal connection lines in the second display area through the second signal connection lines in the second non-display area, so that at least part of the signal lines in the first display area can be led out from the second display area to the first non-display area, thereby saving wiring spaces in areas opposite to the first non-display area and the first non-display area, which can at least reduce border widths of the display panel in the areas.

The above description of the disclosed embodiments is provided to enable a person skilled in the art to make or use the present disclosure. Various modifications to the embodiments will be readily apparent to a person skilled in the art, and the generic principles defined herein may be applied to other embodiments without departing from the spirit or scope of the disclosure. Therefore, the present disclosure is not intended to be limited to the embodiments shown herein but is to be accorded the widest scope consistent with the principles and novel features disclosed herein.

What is claimed is:

1. A display panel comprising a display area and a non-display area at least partially surrounding the display area, the display panel comprising:

a plurality of signal lines, extending along a first direction and located in the display area, the display area including a first display area and a second display area disposed adjacent to the first display area along a second direction, the display area including a first side extending along the first direction, and the first display area located between the first side and the second display area;

first signal connection lines, extending through the display area from a first non-display area on a side of the display area to a second non-display area on the other side of the display area, the first non-display area including a bonding area; and second signal connection lines, located in the second non-display area and extending along the second non-display area, an end of a second signal connection line being connected to a first signal connection line, and another end of the second signal connection line being connected to any one of the plurality of signal lines in the first display area.

2. The display panel according to claim 1, wherein:

the display area includes a plurality of display pixel structures, a display pixel structure of the plurality of display pixel structures includes a display pixel circuit and a display light-emitting element connected to the display pixel circuit;

the non-display area includes a third non-display area adjacent to the first side of the display area, and the third non-display area includes a scan circuit connected to a scan line through a first conductive via to connect the display pixel circuit; and a plurality of dummy pixel structures is arranged in sequence along the first direction between the scan circuit and the first side the display area, and a dummy pixel structure of the plurality of dummy pixel structures includes a dummy pixel circuit and a dummy light-emitting element, and in a direction perpendicular to the display panel, the first conductive via is disposed opposite to the dummy pixel circuit.

3. The display panel according to claim 2, wherein:

the dummy pixel circuit includes a plurality of dummy pixel transistors; and in a direction perpendicular to the display panel, the first conductive via at least partially overlaps a gate electrode of the dummy pixel transistor.

4. The display panel according to claim 1, wherein:

the display area includes a plurality of scan lines arranged in sequence, and the plurality of scan lines is configured on the first metal layer and extends along the second direction;

the non-display area includes a third non-display area adjacent to the first side of the display area, the third non-display area includes a scan circuit, the third non-display area includes a first part, a second part, and a third part arranged in sequence along the first direction, and the scan circuit is connected to the plurality of scan lines through third signal connection lines; and in the first part of the third non-display area, the third signal connection lines are on a second metal layer, and the first metal layer is different from the second metal layer.

5. The display panel according to claim 4, wherein:

the plurality of signal lines and the first signal connection lines are all on the third metal layer;

fan-out lines are between the bonding area and the display area, a part of the fan-out lines is on the first metal layer, another part of the fan-out lines is on a fourth metal layer, the first metal layer, the second metal layer, and the third metal layer and the fourth metal layer are four different metal layers; and at least one of the first metal layer, the third metal layer, and the fourth metal layer includes the second signal connection lines.

6. The display panel according to claim 5, wherein each of the first metal layer, the third metal layer and the fourth metal layer includes at least one of the second signal connection lines.

7. The display panel according to claim 5, wherein any one of the third signal connection lines in the second part and the third part is on at least one layer of the first metal layer to the fourth metal layer.

8. The display panel according to claim 1, wherein:

the non-display area includes a third non-display area adjacent to the first side;

the display area includes a second side adjacent to the second non-display area, and the first side and the second side of the display area are connected by first curves curved toward the display area; and the non-display area includes a first power signal line, the first power signal line at least surrounds the second side and the first curve, and part of the first power signal line opposite to the first curve and another part of the first power signal line opposite to the second side satisfy a condition of same line width.

9. The display panel according to claim 1, wherein in the display area, a wiring pitch in an edge area is smaller than a wiring pitch in a middle area.

10. The display panel according to claim 9, wherein:

in the first display area, at least part of the plurality of signal lines includes a first pitch;

in the second display area, the plurality of signal lines includes a second pitch; and the first pitch is smaller than the second pitch.

11. The display panel according to claim 9, wherein:

the display area includes a plurality of scan lines arranged in sequence, and the plurality of scan lines extends along the second direction; in the display area, in the first direction, the plurality of scan lines in the middle area includes a third pitch; and the display area includes a second side adjacent to the second non-display area, and a plurality of continuously arranged scan lines adjacent to the second side includes a fourth pitch smaller than the third pitch; and/or, the display area includes a third side adjacent to the first non-display area, and a plurality of continuously arranged scan lines adjacent to the third side includes a fifth pitch smaller than the third pitch.

12. The display panel according to claim 11, wherein a first border area includes fan-out lines, the plurality of signal lines and the first signal connection lines all pass through a second conductive via and a corresponding fan-out line; the second conductive via is in the display area, the corresponding fan-out line extends to the display area.

13. The display panel according to claim 1, wherein:

the first display area includes signal lines numbered from a first signal line to an N-th signal line arranged in sequence along the second direction, and N is a positive integer greater than 1;

the second display area includes first signal connection lines numbered from a first first signal connection line to an N-th first signal connection line arranged in sequence along an opposite direction of the second direction;

the second non-display area includes second signal connection lines numbered from a first second signal connection line to an N-th second signal connection line arranged in sequence along the first direction; and an i-th signal line is connected to an i-th first signal connection line through an i-th second signal connection line, and i is a positive integer not greater than N.

14. The display panel according to claim 1, wherein:

the first display area includes signal lines numbered from a first signal line to an N-th signal line arranged in sequence along the second direction, and N is a positive integer greater than 1;

the first signal connection lines extend to the second non-display area, the second display area includes first signal connection lines numbered from a first first signal connection line to an N-th first signal connection line arranged in sequence along the second direction;

the second non-display area includes second signal connection lines numbered from a first second signal connection line to an N-th second signal connection line arranged in sequence along the first direction; and an i-th signal line is connected to an i-th first signal connection line through an i-th second signal connection line, and i is a positive integer not greater than N.

15. The display panel according to claim 1, wherein:

the first non-display area includes a plurality of fourth signal connection lines between the bonding area and the display area;

a plurality of fan-out lines is between the plurality of fourth signal connection lines and the display area, the plurality of signal lines and the first signal connection lines are respectively connected to corresponding fourth signal connection lines by different fan-out lines; and the plurality of signal lines, the first signal connection lines and the fourth signal connection lines are on a same metal layer, and the fan-out lines are on a different metal layer.

16. The display panel according to claim 15, wherein:

an end of a signal line in the second display area and an end of a first signal connection line in the second display area facing the first non-display area are respectively connected to a fan-out line;

in the second direction, the display area includes signal lines numbered from a first signal line to a M-th signal line arranged in sequence, the bonding area includes pads numbered from a first pad to a M-th pad arranged in sequence, and M is a positive integer greater than 1; and the fan-out lines and the fourth signal connection lines are correspondingly connected through the second conductive vias, so that a j-th signal line is connected to a j-th pad, and j is a positive integer not greater than M.

17. The display panel according to claim 1, wherein:

the display area includes a plurality of second power signal lines arranged in sequence, and the plurality of second power signal lines extend along the first direction; and the plurality of second power signal lines is on a different layer from the first signal connection lines, and in the direction perpendicular to the display panel, the first signal line connection lines at least partially overlap adjacent second power signal lines.

18. A display panel comprising a display area and a non-display area at least partially surrounding the display area, the display panel comprising:

a plurality of signal lines, extending along a first direction and located in the display area, the display area including a first display area and a second display area disposed adjacent to the first display area along a second direction, the display area including a first side extending along the first direction, and the first display area located between the first side and the second display area;

first signal connection lines, extending through the display area from a first non-display area on a side of the display area to a second non-display area on the other side of the display area, the first non-display area including a bonding area; and second signal connection lines, located in the second non-display area and extending along the second non-display area, an end of a second signal connection line being connected to a first signal connection line, and another end of the second signal connection line being connected to any one of the plurality of signal lines in the first display area, wherein:

the non-display area includes a third non-display area adjacent to the first side of the display area;

the display area includes a second side adjacent to the second non-display area, and the first side and the second side of the display area are connected by first curves curved toward the display area; and the second signal connection lines include second curves connected to the plurality of signal lines, and the second curves are curved toward the display area.

19. A display panel comprising a display area and a non-display area at least partially surrounding the display area, the display panel comprising:

a plurality of signal lines, extending along a first direction and located in the display area, the display area including a first display area and a second display area disposed adjacent to the first display area along a second direction, the display area including a first side extending along the first direction, and the first display area located between the first side and the second display area;

first signal connection lines, extending through the display area along a first non-display area on a side of the display area to a second non-display area on the other side of the display area, the first non-display area including a bonding area; and second signal connection lines, extending along the second non-display area, an end of a second signal connection line being connected to a first signal connection line, and another end of the second signal connection line being connected to any one of the plurality of signal lines in the first display area, wherein:

the display area also includes at least one auxiliary trace running through the display area along the first direction; and along the second direction, the at least one auxiliary trace and the first signal connection lines are evenly distributed in the display area.

20. The display panel according to claim 19, wherein the at least one auxiliary trace is connected to a fixed potential.

21. The display panel according to claim 20, wherein:

the display area includes a display pixel structure including a display pixel circuit and a display light-emitting element, the display pixel circuit controls the light-emitting element to emit light based on a first fixed potential and a second fixed potential, and the second fixed potential is smaller than the first fixed potential; and the at least one auxiliary trace is connected to the first fixed potential or the second fixed potential.

* * * * *